United States Patent
Yamada et al.

(10) Patent No.: US 12,310,253 B2
(45) Date of Patent: May 20, 2025

(54) MAGNETIC DOMAIN WALL MOVEMENT ELEMENT AND MAGNETIC ARRAY

(71) Applicant: TDK CORPORATION, Tokyo (JP)

(72) Inventors: Shogo Yamada, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 481 days.

(21) Appl. No.: 17/718,801

(22) Filed: Apr. 12, 2022

(65) Prior Publication Data

US 2022/0399487 A1 Dec. 15, 2022

(30) Foreign Application Priority Data

Jun. 9, 2021 (JP) ................................. 2021-096973

(51) Int. Cl.
*H10N 50/80* (2023.01)
*H10B 61/00* (2023.01)
*H10N 50/10* (2023.01)

(52) U.S. Cl.
CPC ............. *H10N 50/80* (2023.02); *H10B 61/20* (2023.02)

(58) Field of Classification Search
CPC ........ H10N 50/80; H10N 50/10; H10B 61/20; H10B 61/22
See application file for complete search history.

(56) References Cited

U.S. PATENT DOCUMENTS

| | | | |
|---|---|---|---|
| 2007/0194359 A1* | 8/2007 | Lim | G11C 19/0808 257/295 |
| 2016/0064654 A1* | 3/2016 | Tonegawa | H10B 61/22 257/421 |
| 2020/0044141 A1 | 2/2020 | Yamada et al. | |
| 2020/0273511 A1 | 8/2020 | Ashida et al. | |
| 2020/0286536 A1 | 9/2020 | Fukami et al. | |

FOREIGN PATENT DOCUMENTS

| | | |
|---|---|---|
| JP | 2009-252909 A | 10/2009 |
| JP | 2010-219104 A | 9/2010 |
| JP | 2020-021857 A | 2/2020 |
| JP | 2020141132 A | 9/2020 |
| WO | 2017208576 A1 | 12/2017 |

\* cited by examiner

*Primary Examiner* — Herve-Louis Y Assouman
(74) *Attorney, Agent, or Firm* — Oliff PLC

(57) ABSTRACT

A magnetic domain wall movement element includes a magnetoresistance effect part, a first electrode, a second electrode, a third electrode, a first magnetization fixed layer, and a second magnetization fixed layer. The magnetoresistance effect part includes a reference layer, a magnetic domain wall movement layer, and a non-magnetic layer. The magnetic domain wall movement layer has a first region and second region in which a magnetization direction is fixed, and a third region in which a magnetization direction is variable. The reference layer overlaps at least part of the first region and the second region in a plan view in a first direction, and at least part of the first region and the second region is shorter than the third region in a third direction orthogonal to the first direction and the second direction.

11 Claims, 14 Drawing Sheets

MAGNETIC DOMAIN WALL MOVEMENT ELEMENT AND MAGNETIC ARRAY

BACKGROUND OF THE INVENTION

Field of the Invention

The present invention relates to a magnetic domain wall movement element and a magnetic array. Priority is claimed on Japanese Patent Application No. 2021-96973, filed Jun. 9, 2021, the content of which is incorporated herein by reference.

Description of Related Art

Next-generation non-volatile memories have been focused upon as an alternative to flash memories and the like whose miniaturization has reached its limit. For example, a magnetoresistive random access memory (MRAM), a resistive random access memory (ReRAM), a phase change random access memory (PCRAM) and the like are known as next-generation non-volatile memories.

In an MRAM, a change in the resistance value caused by the change in the direction of magnetization is used for data recording. In order to realize a large capacity of a recording memory, miniaturizing elements constituting the memory and increasing the number of recording bits per element constituting the memory have been studied.

Patent Document 1 describes a magnetic domain wall movement element that can change a resistance value by moving a magnetic domain wall and record data in multiple values or digitally. In addition, Patent Document 1 describes that a magnetic domain wall movement region in which the magnetic domain wall can move and a magnetization fixing region in which a magnetic domain wall movable range is limited are provided in a data recording layer (magnetic domain wall movement layer).

PATENT DOCUMENTS

[Patent Document 1] Japanese Unexamined Patent Application, First Publication No. 2010-219104

SUMMARY OF THE INVENTION

Magnetic domain wall movement elements are often used in an integrated manner. In order to improve integration of magnetic domain wall movement elements, it is preferable that magnetization fixing regions provided at both ends of the magnetic domain wall movement layer overlap a reference layer of the magnetic domain wall movement element. However, in such a structure, a current path may be formed from the reference layer toward the magnetization fixing region without passing through the magnetic domain wall movement region in which the magnetic domain wall of the magnetic domain wall movement layer can move. When a current flows through this path, the MR ratio, which is a ratio of a maximum resistance value to a minimum resistance value, decreases. In the magnetic domain wall movement element having a low MR ratio, when the magnetic domain wall position is finely controlled, it is not possible to secure a sufficient range in the change of the resistance value and it is not possible to accurately detect the change in the resistance value. That is, it is difficult to increase the number of bits for multi-value data recording of the magnetic domain wall movement element.

The present invention has been made in view of the above problems, and an object of the present invention is to provide a magnetic domain wall movement element and a magnetic array which have a large MR ratio and can increase the number of bits for multi-value data recording.

(1) A magnetic domain wall movement element according to a first aspect includes a magnetoresistance effect part, a first electrode, a second electrode, a third electrode, a first magnetization fixed layer, and a second magnetization fixed layer. The magnetoresistance effect part includes a reference layer containing a ferromagnetic material, a magnetic domain wall movement layer containing a ferromagnetic material, and a non-magnetic layer interposed between the reference layer and the magnetic domain wall movement layer in a first direction. The magnetic domain wall movement layer extends in a second direction orthogonal to the first direction. The magnetic domain wall movement layer has a first region in which a magnetization direction is fixed, a second region in which a magnetization direction is fixed in a direction different from the magnetization direction of the first region, and a third region which is positioned between the first region and the second region in the second direction and in which a magnetization direction is variable. The first electrode is electrically connected to the first region. The second electrode is electrically connected to the second region. The third electrode is electrically connected to the reference layer and is positioned opposite to the non-magnetic layer with respect to the reference layer in the first direction. The first magnetization fixed layer is positioned between the first region and the first electrode and fixes a magnetization of the first region. The second magnetization fixed layer is positioned between the second region and the second electrode and fixes a magnetization of the second region. In a plan view in the first direction, the reference layer overlaps at least part of the first region and the second region. At least part of the first region and the second region is shorter than the third region in a third direction orthogonal to the first direction and the second direction.

(2) The magnetic domain wall movement element according to the above aspect may further include a substrate. The reference layer may be closer to the substrate than the magnetic domain wall movement layer.

(3) In the magnetic domain wall movement element according to the above aspect, a length in the second direction of at least one of the first region and the second region longer than a length in the third direction thereof.

(4) In the magnetic domain wall movement element according to the above aspect, at least one of the first region and the second region may have a first part that is longer than the third region in the third direction and a second part that is shorter than the third region in the third direction. The first part may be closer to the third region than the second part in the second direction.

(5) In the magnetic domain wall movement element according to the above aspect, at least one of the first region and the second region may gradually shorten in length in the third direction from a first end in contact with the third region toward a second end on the opposite side in the second direction.

(6) In the magnetic domain wall movement element according to the above aspect, in the third region, a film thickness at an end in the second direction may be thicker than a film thickness of a center part in the second direction, and a length of the end in the third direction may be shorter than a length of the center part in the third direction.

(7) In the magnetic domain wall movement element according to the above aspect, in a plan view in the first direction, the outer circumference of a first surface, which is a surface closest to the reference layer of the third electrode, may overlap at least one of the first region and the second region.
(8) In the magnetic domain wall movement element according to the above aspect, in a plan view in the first direction, a first surface, which is a surface closest to the reference layer of the third electrode, may include the magnetic domain wall movement layer inside.
(9) In the magnetic domain wall movement element according to the above aspect, in a first surface, which is a surface closest to the reference layer of the third electrode, the length of the longest part in the third direction may be shorter than the length of the longest part in the second direction.
(10) In the magnetic domain wall movement element according to the above aspect, a film thickness of the first magnetization fixed layer may be thicker than a film thickness of the second magnetization fixed layer, and in a plan view in the first direction, a distance from a geometric center of a first surface, which is a surface closest to the reference layer of the third electrode, to the first magnetization fixed layer may be shorter than a distance from the geometric center of the first surface to the second magnetization fixed layer.
(11) In the magnetic domain wall movement element according to the above aspect, in a plan view in the first direction, the first region may be included in the first electrode, and a distance between the outer circumference of the first region and the outer circumference of the first electrode may be the shortest at a first point.
(12) A magnetic array according to a second aspect has a plurality of magnetic domain wall movement elements according to the above aspect.

The magnetic domain wall movement element and the magnetic array according to the above aspects have a large MR ratio and can increase the number of bits for multi-value data recording.

DETAILED DESCRIPTION OF THE INVENTION

Figure 1:
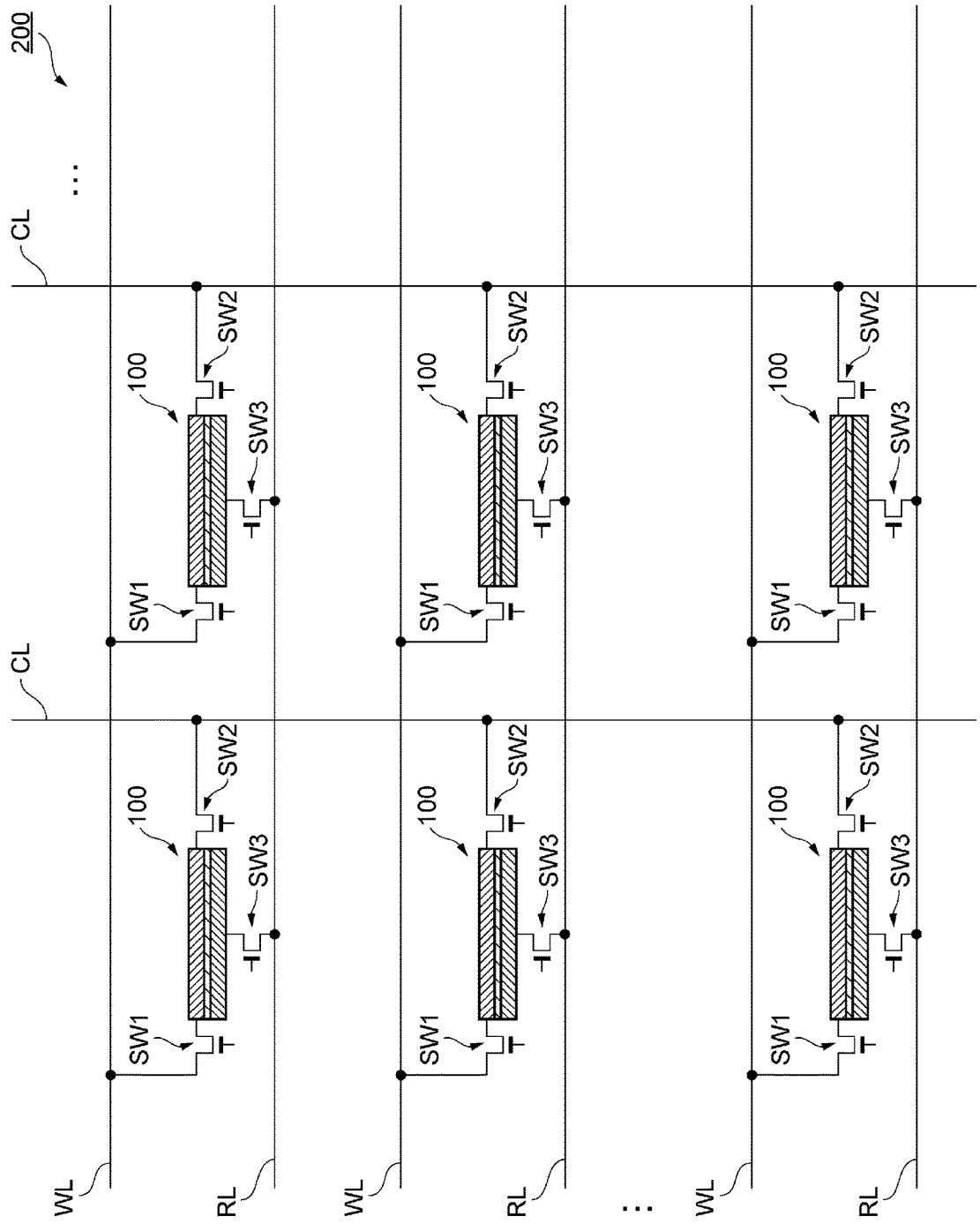
FIG. 1 is a configuration diagram of a magnetic array according to a first embodiment.

The present embodiment will be appropriately described below in detail with reference to the drawings. In the drawings used in the following description, in order to facilitate understanding of the features of the present disclosure, feature parts are enlarged for convenience of illustration in some cases, and size ratios and the like between components may be different from those of actual components. Materials, sizes and the like exemplified in the following description are examples, and the present invention is not limited thereto. Such components can be appropriately changed within a range in which the effects of the present invention are obtained.

First, directions are defined. The x direction and the y direction are directions substantially parallel to one surface of a substrate Sub (refer to FIG. 2) to be described below. The x direction is a direction in which a magnetic domain wall movement layer 1 to be described below extends. The x direction is an example of a second direction. The y direction is a direction orthogonal to the x direction. The y direction is an example of a third direction. The z direction is a direction from the substrate Sub to be described below toward a magnetic domain wall movement element. The z direction is an example of a first direction. In this specification, the +z direction may be expressed as "upward" and the −z direction may be expressed as "downward," but these expressions are only for convenience, and do not define the direction of gravity.

In addition, terms are defined. In this specification, "extend in the x direction" means that the length of the structure in the x direction is longer than the length in the y direction or the z direction. The same applies to other directions. In addition, in this specification, "connection" is not limited to direct connection, but includes, for example, indirect connection with another layer therebetween.

First Embodiment

FIG. 1 is a configuration diagram of a magnetic array 200 according to a first embodiment. The magnetic array 200 includes a plurality of magnetic domain wall movement elements 100, a plurality of first wirings WL, a plurality of second wirings CL, a plurality of third wirings RL, a plurality of first switching elements SW1, a plurality of second switching elements SW2, and a plurality of third switching elements SW3. The magnetic array 200 can be used, for example, in a magnetic memory, a product-sum operation unit, a neuromorphic device, a spin memristor, and a magneto-optical element.

Each of the first wirings WL is a write wiring. Each of the first wirings WL electrically connects a power source to one or more magnetic domain wall movement elements 100. The power source is connected to one end of the magnetic array 200 during use.

Each of the second wirings CL is a common wiring. The common wiring is a wiring that can be used both during data writing and during data reading. Each of the second wirings CL electrically connects a reference potential to one or more magnetic domain wall movement elements 100. The reference potential is, for example, ground. The second wiring CL may be provided in each of the plurality of magnetic domain wall movement elements 100 or may be provided over the plurality of magnetic domain wall movement elements 100.

Each of the third wirings RL is a read wiring. Each of the third wirings RL electrically connects a power source or a reference potential to one or more magnetic domain wall movement elements 100. The power source is connected to one end of the magnetic array 200 during use.

In FIG. 1, the first switching element SW1, the second switching element SW2, and the third switching element SW3 are connected to each of the plurality of magnetic domain wall movement elements 100. The first switching element SW1 is connected between each magnetic domain wall movement element 100 and the first wiring WL. The second switching element SW2 is connected between each magnetic domain wall movement element 100 and the second wiring CL. The third switching element SW3 is connected between each magnetic domain wall movement element 100 and the third wiring RL.

When the predetermined first switching element SW1 and second switching element SW2 are turned on, a write current flows between the first wiring WL and the second wiring CL connected to the predetermined magnetic domain wall movement element 100. When the predetermined second switching element SW2 and third switching element SW3 are turned on, a read current flows between the second wiring CL and the third wiring RL connected to the predetermined magnetic domain wall movement element 100.

The first switching element SW1, the second switching element SW2 and the third switching element SW3 are elements that control a current flow. The first switching element SW1, the second switching element SW2 and the third switching element SW3 are, for example, a transistor, an element that uses a change in the phase of a crystal layer such as an ovonic threshold switch (OTS), an element that uses a change in a band structure such as a metal-insulator transition (MIT) switch, an element that uses a breakdown voltage such as a Zener diode and an avalanche diode, and an element whose conductivity changes as the atomic position changes.

Any of the first switching element SW1, the second switching element SW2, and the third switching element SW3 may be shared by the magnetic domain wall movement element 100 connected to the same wiring. For example, when the first switching element SW1 is shared, one first switching element SW1 is provided upstream (one end) from the first wiring WL. For example, when the second switching element SW2 is shared, one second switching element SW2 is provided upstream (one end) from the second wiring CL. For example, when the third switching element SW3 is shared, one third switching element SW3 is provided upstream (one end) of the third wiring RL.

Figure 2:
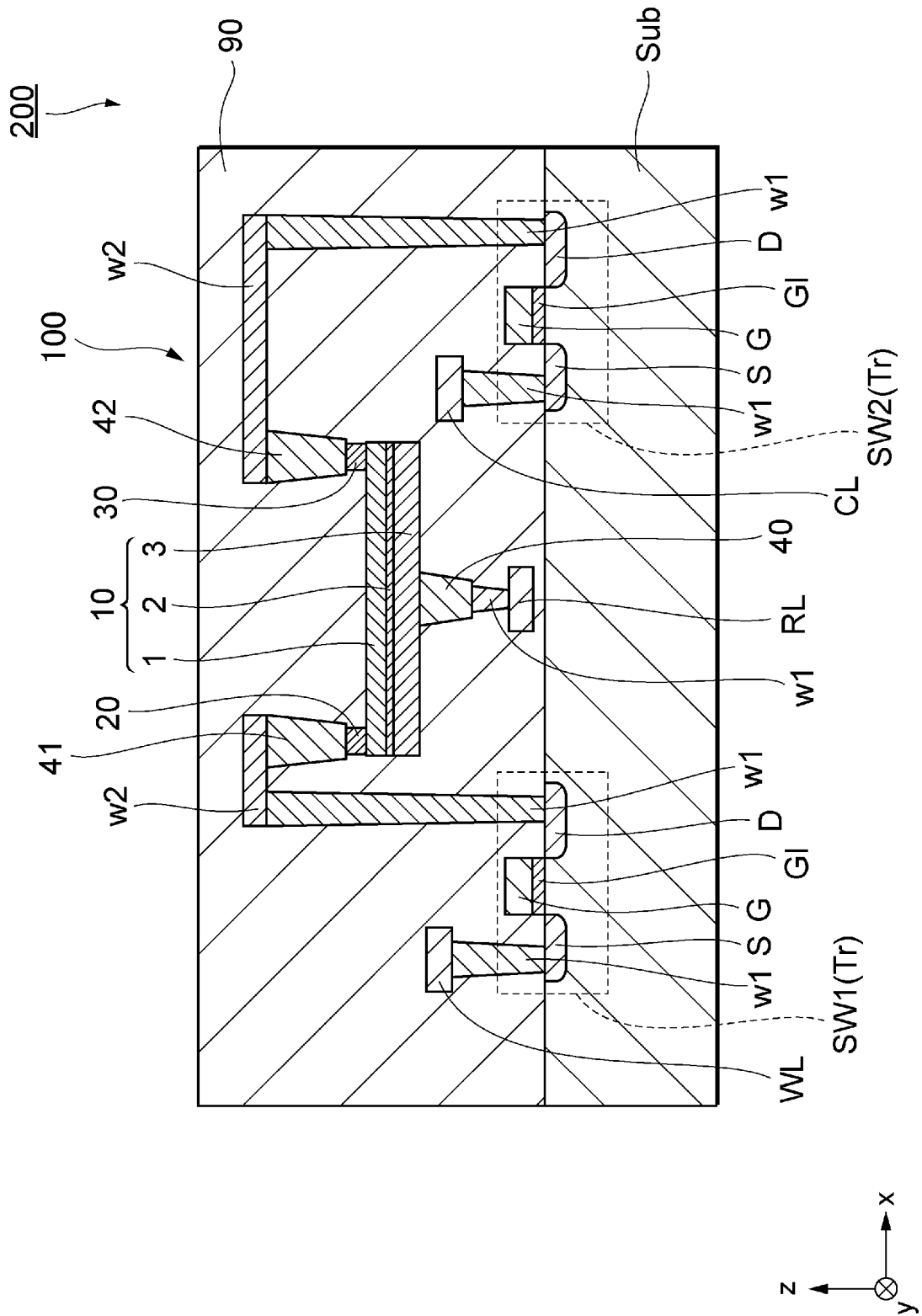
FIG. 2 is a cross-sectional view of the vicinity of magnetic domain wall movement elements of the magnetic array according to the first embodiment.

FIG. 2 is a cross-sectional view of the vicinity of the magnetic domain wall movement element 100 of the magnetic array 200 according to the first embodiment. FIG. 2 is a cross section of one magnetic domain wall movement element 100 in FIG. 1 cut along an xz plane that passes through the center of the width of the magnetic domain wall movement layer 1 in the y direction.

The first switching element SW1 and the second switching element SW2 shown in FIG. 2 are a transistor Tr. The transistor Tr includes a gate electrode G, a gate insulating film GI, and a source S and a drain D formed in the substrate Sub. The source S and the drain D are defined by a current flow direction, and both are active regions. FIG. 2 shows only one example, and the positional relationship between the source S and the drain D may be reversed. The substrate Sub is, for example, a semiconductor substrate. The third switching element SW3 is electrically connected to the third wiring RL, and is located, for example, at a position displaced in the y direction in FIG. 2.

Each of the transistors Tr and the magnetic domain wall movement element 100 are electrically connected to each other via wirings w1 and w2. The wirings w1 and w2 contain a conductive material. The wiring w1 is a via wiring that extends in the z direction. The wiring w2 is an in-plane wiring that extends in any direction in the xy plane. The wirings w1 and w2 are formed in an opening of an insulation layer 90.

The insulation layer 90 is an insulation layer that insulates between the wirings of the multilayer wiring and between the elements. The insulation layer 90 is made of, for example, silicon oxide ($SiO_x$), silicon nitride ($SiN_x$), silicon carbide (SiC), chromium nitride (CrN), silicon carbon nitride (SiCN), silicon oxynitride (SiON), aluminum oxide ($Al_2O_3$), zirconium oxide ($ZrO_x$), or magnesium oxide (MgO).

Although FIG. 2 shows an example in which the magnetic domain wall movement element 100 is positioned above the substrate Sub with the insulation layer 90 therebetween, the magnetic domain wall movement element 100 may be provided on the substrate Sub.

"Magnetic Domain Wall Movement Element"

Figure 3:
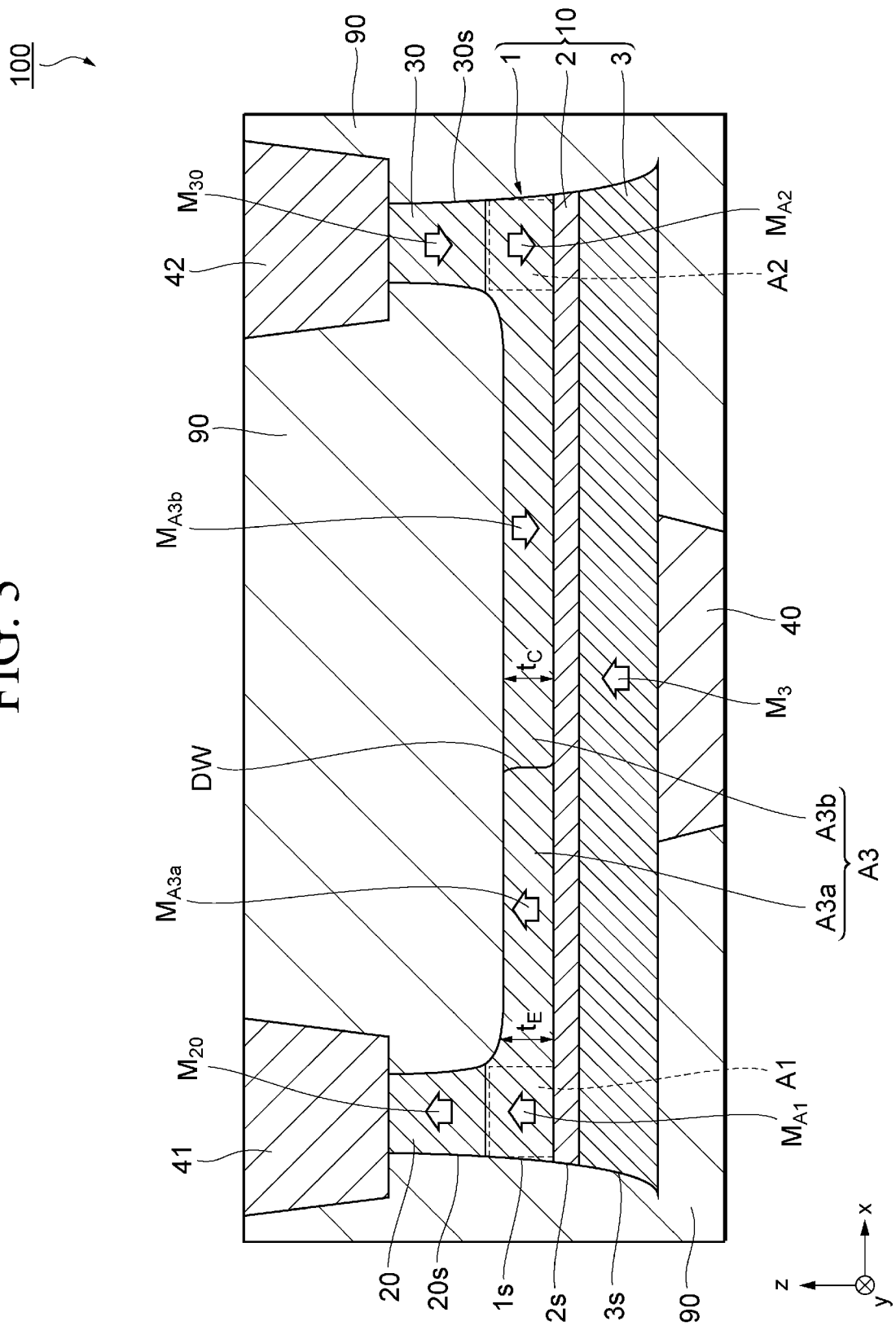
FIG. 3 is a cross-sectional view of the magnetic domain wall movement element according to the first embodiment.
Figure 4:
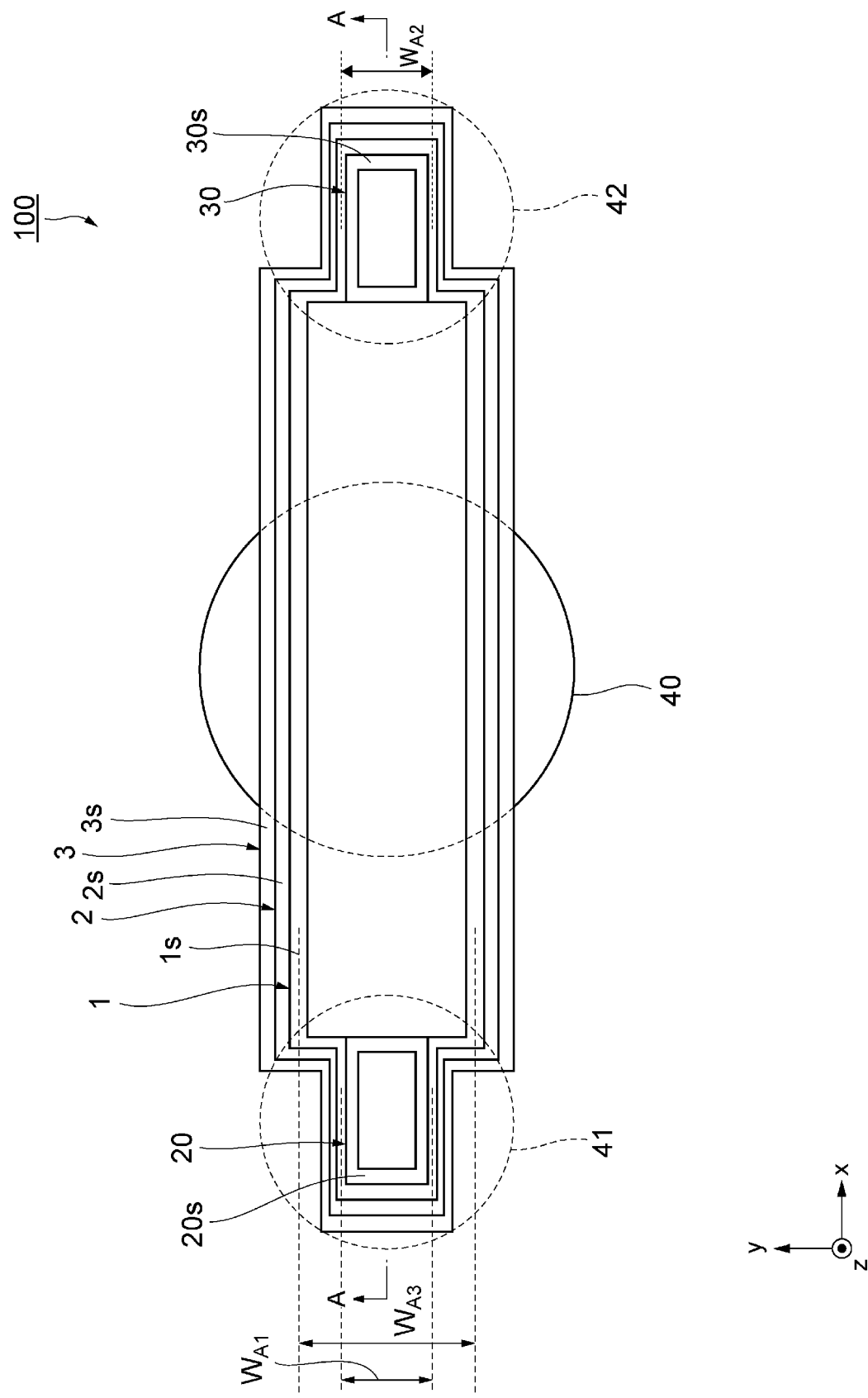
FIG. 4 is a plan view of the magnetic domain wall movement element according to the first embodiment.

FIG. 3 is a cross-sectional view of the magnetic domain wall movement element 100 cut along an xz plane that passes through the center of the magnetic domain wall movement layer 1 in the y direction. FIG. 3 is a cross section taken along the line A-A of FIG. 4. FIG. 4 is a plan view of the magnetic domain wall movement element 100 in a plan view in the z direction. In FIG. 4, a first electrode 41, a second electrode 42 and a part which overlaps a magnetoresistance effect part 10 of a third electrode 40 are indicated by dashed lines. Arrows shown in FIG. 3 are examples of the orientation direction of the magnetization of the ferromagnetic material.

The magnetic domain wall movement element 100 is, for example, a three-terminal type element including a magnetoresistance effect part 10, a first magnetization fixed layer 20, a second magnetization fixed layer 30, a first electrode 41, a second electrode 42 and a third electrode 40. The periphery of the magnetic domain wall movement element 100 is covered with the insulation layer 90.

The magnetoresistance effect part 10 includes a magnetic domain wall movement layer 1, a non-magnetic layer 2, and a reference layer 3. In the magnetic domain wall movement element 100, for example, from the side close to the substrate Sub, the third electrode 40, the reference layer 3, the non-magnetic layer 2, the magnetic domain wall movement layer 1, the first magnetization fixed layer 20, the second magnetization fixed layer 30, the first electrode 41 and the second electrode 42 are provided in that order. The reference layer 3 is closer to the substrate Sub than the magnetic domain wall movement layer 1, and the magnetic domain wall movement element 100 is called a bottom pin structure. When data is written in the magnetoresistance effect part 10, a write current flows along the magnetic domain wall movement layer 1. When data is read from the magnetoresistance effect part 10, a read current flows between the third electrode 40 and the first electrode 41 or the second electrode 42, and a current is applied in the z direction of the magnetoresistance effect part 10.

The magnetic domain wall movement layer 1 extends in the x direction. The magnetic domain wall movement layer 1 has a plurality of magnetic domains therein and has a magnetic domain wall DW at the boundary of the plurality of magnetic domains. The magnetic domain wall movement layer 1 is, for example, a layer in which multi-value data is magnetically recordable as the magnetic state changes. The magnetic domain wall movement layer 1 may be called an "analog layer" or a "magnetic recording layer."

The magnetic domain wall movement layer 1 has a first region A1, a second region A2, and a third region A3. The first region A1 is, for example, a region from a first end of the magnetic domain wall movement layer 1 in the x direction to a position overlapping the inner end of the element of the first magnetization fixed layer 20. The second region A2 is, for example, a region from a second end on the side opposite to the first end of the magnetic domain wall movement layer 1 in the x direction to a position overlapping the inner end of the element of the second magnetization fixed layer 30. The third region A3 is a region interposed between the first region A1 and the second region A2 in the x direction.

The magnetization $M_{A1}$ of the first region A1 is, for example, fixed in the same direction as the magnetization $M_{20}$ of the first magnetization fixed layer 20. The magnetization $M_{A2}$ of the second region A2 is, for example, fixed in the same direction as the magnetization $M_{30}$ of the second magnetization fixed layer 30. When it is described that the magnetization is fixed, it means that the magnetization is not reversed in a general operation (no external force exceeding the assumption is applied) of the magnetic domain wall movement element 100. The magnetization directions of the magnetization $M_{A1}$ of the first region A1 and the magnetization $M_{A2}$ of the second region A2 are, for example, opposite.

The third region A3 is a region in which the direction of magnetization changes and the magnetic domain wall DW can move. For example, the length of the third region A3 in the y direction is substantially constant. In the third region A3, for example, the film thickness $t_E$ at the end in the x direction is thicker than the film thickness $t_C$ at the center part in the x direction. For example, the film thickness of the third region A3 increases continuously from the center part in the x direction toward the end in the x direction. The third region A3 has a first magnetic domain A3a and a second magnetic domain A3b. For example, the magnetization directions of the magnetization $M_{A3a}$ of the first magnetic domain A3a and the magnetization $M_{A3b}$ of the second magnetic domain A3b are opposite. The boundary between the first magnetic domain A3a and the second magnetic domain A3b is the magnetic domain wall DW. For example, the magnetization $M_{A3a}$ of the first magnetic domain A3a is oriented in the same direction as the magnetization MAI of the first region A1. For example, the magnetization $M_{A3b}$ of the second magnetic domain A3b is oriented in the same direction as the magnetization $M_{A2}$ of the second region A2. In principle, the magnetic domain wall DW moves in the third region A3 and does not enter the first region A1 and the second region A2.

As shown in FIG. 4, the length Wm of the first region A1 in the y direction is shorter than the length $W_{A3}$ of the third region A3 in the y direction. In addition, the length $W_{A2}$ of the second region A2 in the y direction is shorter than the length $W_{A3}$ of the third region A3 in the y direction. Here, the length of each region in the y direction is an average of the length in the y direction on the lower surface of each region and the length in the y direction on the upper surface of each region. Here, although both the length $W_{A1}$ and the length $W_{A2}$ are shorter than the length $W_{A3}$ in the example, only one of the length $W_{A1}$ and the length $W_{A2}$ may be shorter than the length $W_{A3}$. In the first region A1, for example, the length in the x direction is longer than the length in the y direction. In addition, in the second region A2, for example, the length in the x direction may be longer than the length in the y direction. The boundary between the first region A1 and the third region A3 and the boundary between the second region A2 and the third region A3 are substantially orthogonal to, for example, the x direction, which is a direction in which the magnetic domain wall movement layer 1 extends.

When the volume ratio of the first magnetic domain A3a and the second magnetic domain A3b in the third region A3 changes, the magnetic domain wall DW moves. The magnetic domain wall DW moves when a write current flows in the x direction of the third region A3. For example, when a write current (for example, a current pulse) is applied in the +x direction of the third region A3, electrons flow in the −x direction opposite to that of the current, and thus the magnetic domain wall DW moves in the −x direction. When a current flows from the first magnetic domain A3a toward the second magnetic domain A3b, spin-polarized electrons in the second magnetic domain A3b reverse the magnetization of the first magnetic domain A3a. When the magnetization of the first magnetic domain A3a is reversed, the magnetic domain wall DW moves in the −x direction.

When the volume ratio of the first magnetic domain A3a and the second magnetic domain A3b in the magnetic domain wall movement layer 1 changes, the resistance value of the magnetic domain wall movement element 100 changes. The resistance value of the magnetic domain wall movement element 100 changes according to a relative angle of the magnetization of the ferromagnetic layer with the non-magnetic layer 2 therebetween. In the case of the magnetic domain wall movement element 100 shown in FIG. 3, the resistance value changes according to a relative angle between the magnetizations $M_{A1}$, $M_{A3a}$, $M_{A3b}$, and $M_{A2}$ of the magnetic domain wall movement layer 1 and the magnetization $M_3$ of the reference layer 3. When the ratio of the first magnetic domain A3a is high, the resistance value of the magnetic domain wall movement element 100 is small, and when the ratio of the second magnetic domain A3b is high, the resistance value of the magnetic domain wall movement element 100 is large. When the position of the magnetic domain wall DW is finely controlled, the resistance value can be finely controlled, and analog multi-value data can be recorded.

In the magnetic domain wall movement element 100, the reference layer 3 overlaps the first region A1 and the second region A2 with the non-magnetic layer 2 therebetween. The first region A1 and the second region A2 of which magnetizations are fixed do not contribute to the change in the resistance value of the magnetic domain wall movement element 100. That is, when the proportion of the magnetic domain wall movement layer 1 occupied by the first region A1 and the second region A2 is high, the MR ratio, which is a ratio of the maximum resistance value and the minimum resistance value, decreases in the magnetic domain wall movement element 100.

The magnetic domain wall movement layer 1 contains a magnetic material. The magnetic domain wall movement layer 1 may contain a ferromagnetic material, a ferrimagnetic material, or a combination of these with an antiferromagnetic material whose magnetic state can be changed by a current. The magnetic domain wall movement layer 1 preferably contains at least one element selected from the group consisting of Co, Ni, Fe, Pt, Pd, Gd, Tb, Mn, Ge, and Ga. Examples of materials used in the magnetic domain wall movement layer 1 include a Co and Ni laminated film, a Co and Pt laminated film, a Co and Pd laminated film, and a CoFe and Pd laminated film, a MnGa-based material, a GdCo-based material, and a TbCo-based material. Ferrimagnetic materials such as a MnGa-based material, a GdCo-based material, and a TbCo-based material have small saturation magnetization, and a threshold current required to move the magnetic domain wall DW becomes small. In addition, the Co and Ni laminated film, the Co and Pt laminated film, and the Co and Pd laminated film have a large coercive force and the moving speed of the magnetic domain wall DW becomes slow. Examples of antiferromagnetic materials include $Mn_3X$ (X is Sn, Ge, Ga, Pt, Ir, etc.), CuMnAs, and $Mn_2Au$. The magnetic domain wall movement layer 1 may be composed of a plurality of layers. The same material as in the reference layer 3 to be described below can be applied for the magnetic domain wall movement layer 1.

The non-magnetic layer 2 is positioned between the magnetic domain wall movement layer 1 and the reference layer 3. The non-magnetic layer 2 is laminated, for example, on one surface of the reference layer 3.

The non-magnetic layer 2 is made of, for example, a non-magnetic insulator, a semiconductor or a metal. The non-magnetic insulator is, for example, $Al_2O_3$, $SiO_2$, MgO, $MgAl_2O_4$, and a material in which some of these Al, Si, and Mg are replaced with Zn, Be or the like. These materials have a large band gap and exceptional insulation. When the non-magnetic layer 2 is composed of a non-magnetic insulator, the non-magnetic layer 2 is a tunnel barrier layer. Examples of non-magnetic metals include Cu, Au, and Ag. Examples of non-magnetic semiconductors include Si, Ge, $CuInSe_2$, $CuGaSe_2$, and $Cu(In, Ga)Se_2$.

The thickness of the non-magnetic layer 2 is, for example, 20 Å or more, and may be 25 Å or more. When the thickness of the non-magnetic layer 2 is thick, the resistance area product (RA) of the magnetic domain wall movement element 100 becomes large. The resistance area product (RA) of the magnetic domain wall movement element 100 is preferably $1\times10^4$ $\Omega\mu m^2$ or more, and more preferably $5\times10^4$ $\Omega\mu m^2$ or more. The resistance area product (RA) of the magnetic domain wall movement element 100 is expressed as a product of the element resistance of one magnetic domain wall movement element 100 and the element cross-sectional area (the area of the cut surface obtained by cutting the non-magnetic layer 2 in the xy plane) of the magnetic domain wall movement element 100.

The non-magnetic layer 2 is interposed between the reference layer 3 and the magnetic domain wall movement layer 1. For example, the reference layer 3 is laminated on the third electrode 40. The reference layer 3 is located at a position at which it overlaps the magnetic domain wall movement layer 1 in the z direction. The reference layer 3 is located at a position at which at least part thereof overlaps the first region A1, the second region A2, and the third region A3 in the z direction. The magnetization $M_3$ of the reference layer 3 is less likely to be reversed than the magnetizations $M_{A3a}$ and $M_{A3b}$ of the third region A3 of the magnetic domain wall movement layer 1. When an external force of a degree at which the magnetizations $M_{A3a}$ and $M_{A3b}$ of the third region A3 are reversed is applied, the magnetization $M_3$ of the reference layer 3 does not change its direction and is fixed. The reference layer 3 may be referred to as a magnetization fixed layer. The reference layer 3 may be composed of a plurality of layers. For example, it may have a plurality of ferromagnetic layers and an intermediate layer interposed between the plurality of ferromagnetic layers. Two ferromagnetic layers with an intermediate layer therebetween may be magnetically coupled to form a synthetic antiferromagnetic structure (SAF).

The reference layer 3 contains a ferromagnetic material. The reference layer 3 contains, for example, a material that easily produces a coherent tunnel effect with the magnetic domain wall movement layer 1. The reference layer 3 contains, for example, a metal selected from the group consisting of Cr, Mn, Co, Fe and Ni, an alloy containing one or more of these metals, or an alloy containing these metals and at least one element of B, C, and N. The reference layer 3 contains, for example, Co—Fe, Co—Fe—B, or Ni—Fe.

The reference layer 3 may contain, for example, a Heusler alloy. The Heusler alloy is a half-metal and has high spin polarizability. The Heusler alloy is an intermetallic compound having a chemical composition of XYZ or $X_2YZ$. In the periodic table, X is a transition metal element from the Co, Fe, Ni, or Cu groups or a noble metal, Y is a transition metal from the Mn, V, Cr or Ti groups or an element type of X, and Z is a typical element from Group III to Group V. Examples of Heusler alloys include $Co_2FeSi$, $Co_2FeGe$, $Co_2FeGa$, $Co_2MnSi$, $Co_2Mn_{1-a}Fe_aAl_bSi_{1-b}$, and $Co_2FeGe_{1-c}Ga_c$.

The first magnetization fixed layer 20 and the second magnetization fixed layer 30 are directly or indirectly connected to the magnetic domain wall movement layer 1. Indirectly connected means that another layer is interposed between the first magnetization fixed layer 20 and the magnetic domain wall movement layer 1, and between the second magnetization fixed layer 30 and the magnetic domain wall movement layer 1. The first magnetization fixed layer 20 and the second magnetization fixed layer 30 are, for example, on the magnetic domain wall movement layer 1. The first magnetization fixed layer 20 and the second magnetization fixed layer 30 are separated from each other in the x direction. The first magnetization fixed layer 20 fixes the magnetization $M_{A1}$ of the first region A1. The second magnetization fixed layer 30 fixes the magnetization $M_{A2}$ of the second region A2. The first magnetization fixed layer 20 and the second magnetization fixed layer 30 are located, for example, at positions at which they overlap the non-magnetic layer 2 and the reference layer 3 in the z direction.

The first magnetization fixed layer 20 and the second magnetization fixed layer 30 include, for example, a ferromagnetic layer. The first magnetization fixed layer 20 and the second magnetization fixed layer 30 contain, for example, a material different from that of the magnetic domain wall movement layer 1 and have different film configurations. In addition, the first magnetization fixed layer 20 and the second magnetization fixed layer 30 may be composed of, for example, a plurality of layers. For example, it may have a plurality of ferromagnetic layers and an intermediate layer interposed between the plurality of ferromagnetic layers. Two ferromagnetic layers with an intermediate layer interposed between may be magnetically coupled to form a synthetic antiferromagnetic structure (SAF). In addition, the first magnetization fixed layer 20 and the second magnetization fixed layer 30 may have different film configurations and film thicknesses.

The third electrode 40 is electrically connected to the reference layer 3. The third electrode 40 is positioned, for example, closer to the substrate Sub than the reference layer 3. For example, the third electrode 40 is positioned opposite to the non-magnetic layer 2 with respect to the reference layer 3. For example, the first electrode 41 is electrically connected to the first region A1 with the first magnetization fixed layer 20 therebetween. The first magnetization fixed layer 20 is positioned between the first region A1 and the first electrode 41. For example, the second electrode 42 is electrically connected to the second region A2 with the second magnetization fixed layer 30 therebetween. The second magnetization fixed layer 30 is positioned between the second region A2 and the second electrode 42. The third electrode 40, the first electrode 41, and the second electrode 42 contain, for example, a non-magnetic conductive material, and contain a material having higher thermal conductivity than the magnetic domain wall movement layer 1 and the reference layer 3. In addition, the third electrode 40, the first electrode 41, and the second electrode 42 may be formed of, for example, materials different from each other. The third electrode 40, the first electrode 41, and the second electrode 42 are, for example, via wirings that extend in the z direction.

The magnetic domain wall movement element 100 according to the first embodiment has a large MR ratio and can increase the number of bits for multi-value data recording.

As described above, the magnetic domain wall movement element 100 is located at a position at which the first region A1 and the second region A2 overlap the reference layer 3 with the non-magnetic layer 2 therebetween in the z direction in order to improve integration. The first region A1 and the second region A2 have a shorter length in the y direction than the third region A3. With such a structure, in the magnetic domain wall movement layer 1, the proportion occupied by the first region A1 and the second region A2 that do not contribute to the change in the resistance value can be reduced. That is, the MR ratio which is a ratio of a maximum resistance value to a minimum resistance value of the magnetic domain wall movement element 100 can be increased and the number of bits for multi-value data recording can be increased. Here, the idea of forming the width of the magnetization fixing region narrower than the width of magnetic domain wall movement region in order to increase the number of bits for multi-value data recording as in the magnetic domain wall movement element according to the present embodiment is contrary to the conventional technical common sense that the width of the magnetization fixing region is made thicker than the width of the magnetic domain wall movement region in order to stabilize the magnetization fixing function.

In addition, the first region A1 and the second region A2 of the magnetic domain wall movement element 100 according to the first embodiment have a length in the x direction that is longer than a length in the y direction. When the length of the first region A1 and the second region A2 in the y direction is shorter than the length of the third region A3 in the y direction, the current density during data writing is higher in the first region A1 and the second region A2 than in the third region A3. The magnetic domain wall DW moves at a high speed when the current density increases. When the length of the first region A1 and the second region A2 in the x direction is made longer than the length in the y direction, the proportion of the magnetic domain wall movement layer 1 occupied by the first region A1 and the second region A2 is low and it is possible to prevent the magnetic domain wall DW from reaching the element outer end of the first region A1 and the second region A2 and the entire magnetic domain wall movement layer 1 from being formed into a single magnetic domain.

In addition, in the magnetic domain wall movement element 100 according to the first embodiment, the boundary between the first region A1 and the third region A3 and the boundary between the second region A2 and the third region A3 are substantially orthogonal to the x direction which is a direction in which the magnetic domain wall movement layer 1 extends. Since the boundary between the first region A1 and the third region A3 and the boundary between the second region A2 and the third region A3 are orthogonal to each other, the magnetic domain wall DW that is almost parallel in the y direction can be made to move constantly. When the magnetic domain wall DW that is almost parallel in the y direction moves constantly, even if the position of the magnetic domain wall DW is finely controlled and the resistance value is changed in an analog manner, the amount of change in the resistance value can be always constant.

The direction of the magnetization of each layer of the magnetic domain wall movement element 100 can be confirmed, for example, by measuring the magnetization curve. The magnetization curve can be measured using, for example, a magneto optical Kerr effect (MOKE). The measurement with the MOKE is a measurement method performed by making linear polarization be incident on a measurement subject and using a magneto-optical effect (magnetic Kerr effect) in which rotation in the polarization direction occurs.

The magnetic domain wall movement element 100 can be produced by a known method. Each layer of the magnetic domain wall movement element 100 is formed into a film and processed into a predetermined shape. For the film formation of each layer, a sputtering method, a chemical vapor deposition (CVD) method, an electron beam deposition method (EB deposition method), an atomic laser deposition method and the like can be used. The processing of each layer can be performed using a technique such as photolithography and etching (for example, Ar etching).

Second Embodiment

Figure 5:
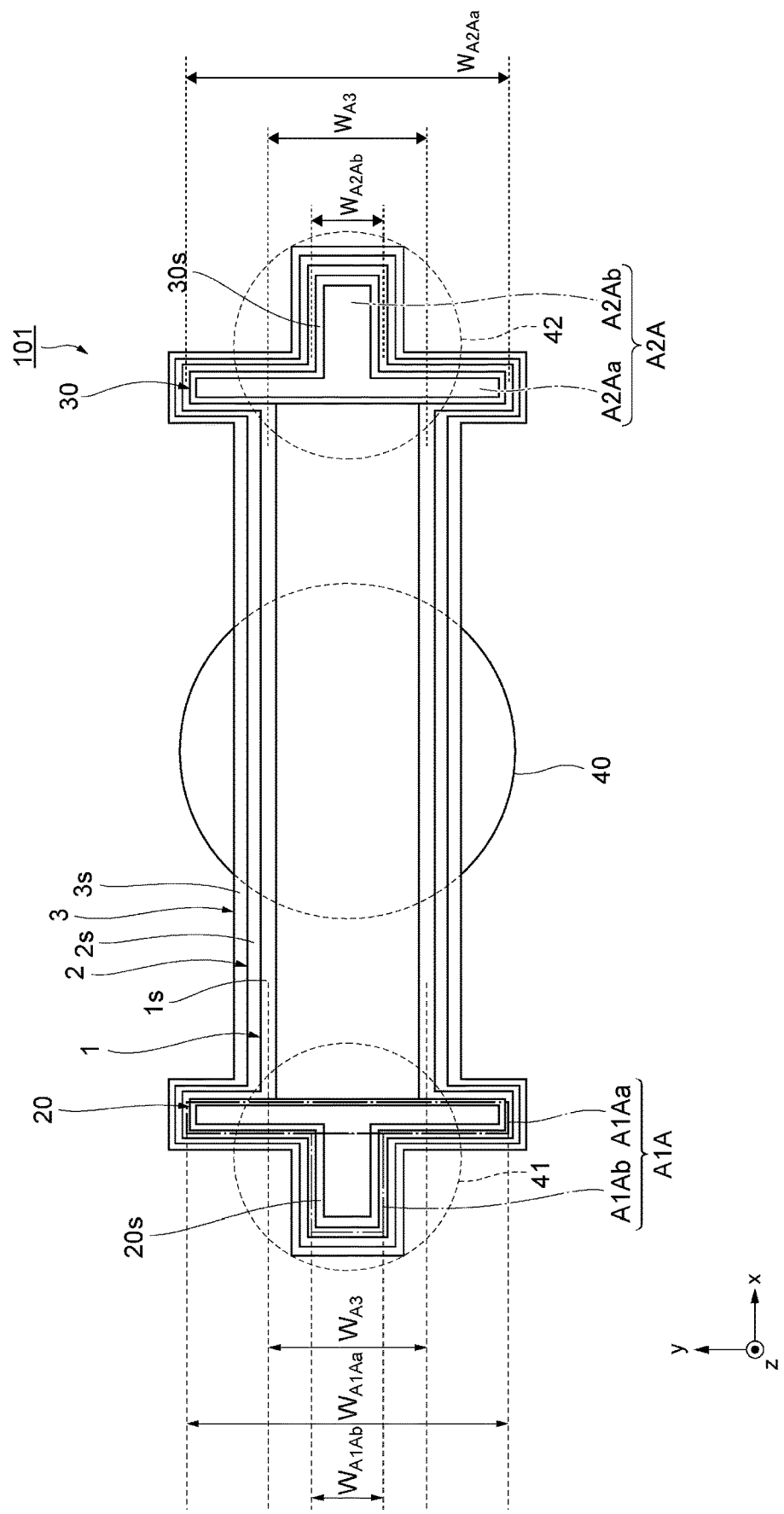
FIG. 5 is a plan view of a magnetic domain wall movement element according to a second embodiment.

FIG. 5 is a plan view of a magnetic domain wall movement element 101 according to a second embodiment in a plan view in the z direction. In FIG. 5, a first electrode 41, a second electrode 42 and a part which overlaps a magnetoresistance effect part 10 of a third electrode 40 are indicated by dashed lines. In the magnetic domain wall movement element 101 according to the second embodiment, the configurations of the first region A1, the second region A2, the first electrode 41 and the second electrode 42 are different from those of the first embodiment. In the second embodiment, the same configurations as in the first embodiment are denoted with the same reference numerals and descriptions thereof will be omitted.

As shown in FIG. 5, a first region A1A has a first part A1Aa and a second part A1Ab. The length $W_{A1Aa}$ of the first part A1Aa in the y direction is longer than the length $W_{A3}$ of the third region A3 in the y direction. The length $W_{A1Ab}$ of the second part A1Ab in the y direction is shorter than the length $W_{A3}$ of the third region A3 in the y direction. The length $W_{A1Aa}$ of the first part A1Aa in the y direction is longer than the length $W_{A1Ab}$ of the second part A1Ab in the y direction. The first part A1Aa is positioned closer to the third region A3 than the second part A1Ab in the x direction.

In addition, a second region A2A has a first part A2Aa and a second part A2Ab. The length $W_{A2Aa}$ of the first part A2Aa in the y direction is longer than the length $W_{A3}$ of the third region A3 in the y direction. The length $W_{A2Ab}$ of the second part A2Ab in the y direction is shorter than the length $W_{A3}$ of the third region A3 in the y direction. The length $W_{A2Aa}$ of the first part A2Aa in the y direction is longer than the length $W_{A2Ab}$ of the second part A2Ab in the y direction. The first part A2Aa is positioned closer to the third region A3 than the second part A2Ab in the x direction.

The magnetic domain wall movement element 101 according to the second embodiment has the same effects as the magnetic domain wall movement element 100 according to the first embodiment. In addition, in the first region A1A, when the first part A1Aa whose length in the y direction is longer than the third region A3 is provided on the side of the third region A3 and the current density during data writing is lowered, it is possible to prevent the magnetic domain wall DW from entering the inside of the first region A1A.

In addition, an example in which the first region A1A and the second region A2A each have a first part and a second part is shown here, but only one of the first region A1A and the second region A2A may have a first part and a second part.

Third Embodiment

Figure 6:
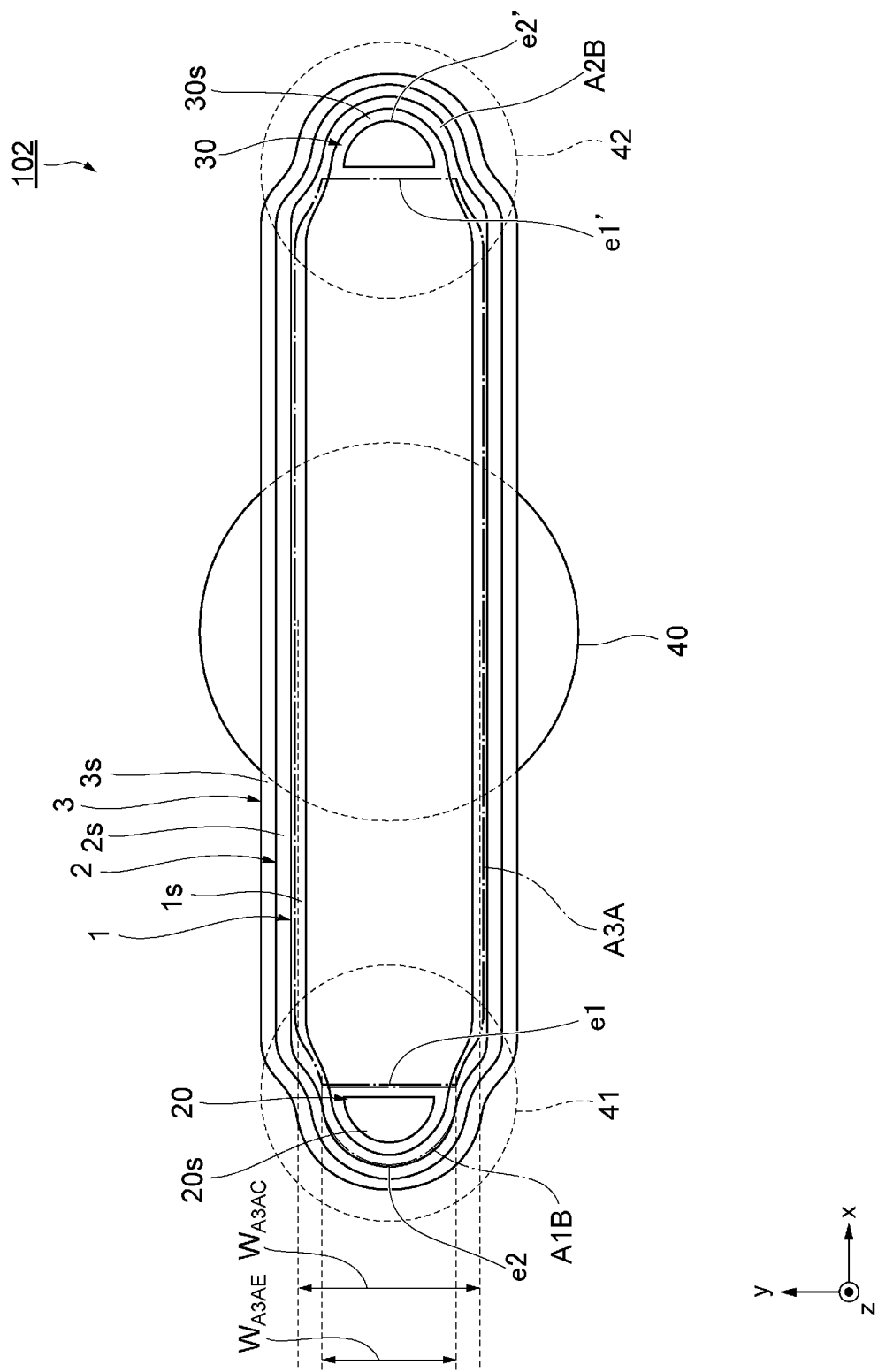
FIG. 6 is a plan view of a magnetic domain wall movement element according to a third embodiment.

FIG. 6 is a plan view of a magnetic domain wall movement element 102 according to a third embodiment in a plan view in the z direction. In FIG. 6, a first electrode 41, a second electrode 42 and a part which overlaps a magnetoresistance effect part 10 of a third electrode 40 are indicated by dashed lines. In the magnetic domain wall movement element 102 according to the third embodiment, the configuration of the first region A1 and the configuration of the third region A3 are different from those of the first embodiment. In the third embodiment, the same configurations as in the first embodiment are denoted with the same reference numerals and descriptions thereof will be omitted.

As shown in FIG. 6, a first region A1B in the y direction gradually shortens in length from a first end e1 in contact with a third region A3A toward a second end e2 on the opposite side in the x direction. The first region A1B in the y direction continuously changes in length, for example, from the first end e1 in contact with the third region A3A toward the second end e2 on the opposite side in the x direction. In addition, in the third region A3A, the length $W_{A3AE}$ in the y direction of the end in the x direction is shorter than the length $W_{A3AC}$ in the y direction of the center part in the x direction. In addition, in the third region A3A, for example, as in the third region A3 shown in FIG. 3, the film thickness $t_E$ of the end in the x direction is thicker than the film thickness $t_C$ of the center part in the x direction, and the film thickness continuously increases from the center part in the x direction toward the end in the x direction.

Similarly, a second region A2B in the y direction gradually shortens in length from the first end e1' in contact with the third region A3A toward the second end e2' on the opposite side in the x direction. For example, the second region A2B in the y direction continuously changes in length from the first end e1' in contact with the third region A3A toward the second end e2' on the opposite side in the x direction.

The magnetic domain wall movement element 102 according to the third embodiment has the same effects as the magnetic domain wall movement element 100 according to the first embodiment. In addition, when the first region A1B in the y direction gradually shortens in length from the first end e1 in contact with the third region A3A toward the second end e2 on the opposite side in the x direction, it is possible to minimize a rapid increase in the current density during data writing in the first region A1B, and it is possible to prevent the magnetic domain wall DW from reaching the element outer end and the entire magnetic domain wall movement layer 1 from being formed into a single magnetic domain. In addition, when the film thickness continuously increases from the center part of the third region A3 in the x direction toward the end, it is possible to minimize heat generation due to the concentration of the current on the corner. In addition, when the length $W_{A3AE}$ in the y direction of the end in the x direction is shorter than the length $W_{A3AC}$ in the y direction of the center part in the x direction of the third region A3, it is possible to minimize a decrease in the current density during data writing at the end of the third region A3 due to increased film thickness. If the current density during data writing at the end of the third region A3 is lower than that of the center part, there is a risk of the magnetic domain wall DW being trapped at the end. These effects are similarly obtained when the second region A2B satisfies the above configuration.

In addition, an example in which both the first region A1B and the second region A2B have the same shape is shown here, but only one of the first region A1B and the second region A2B may have the above configuration.

Fourth Embodiment

Figure 7:
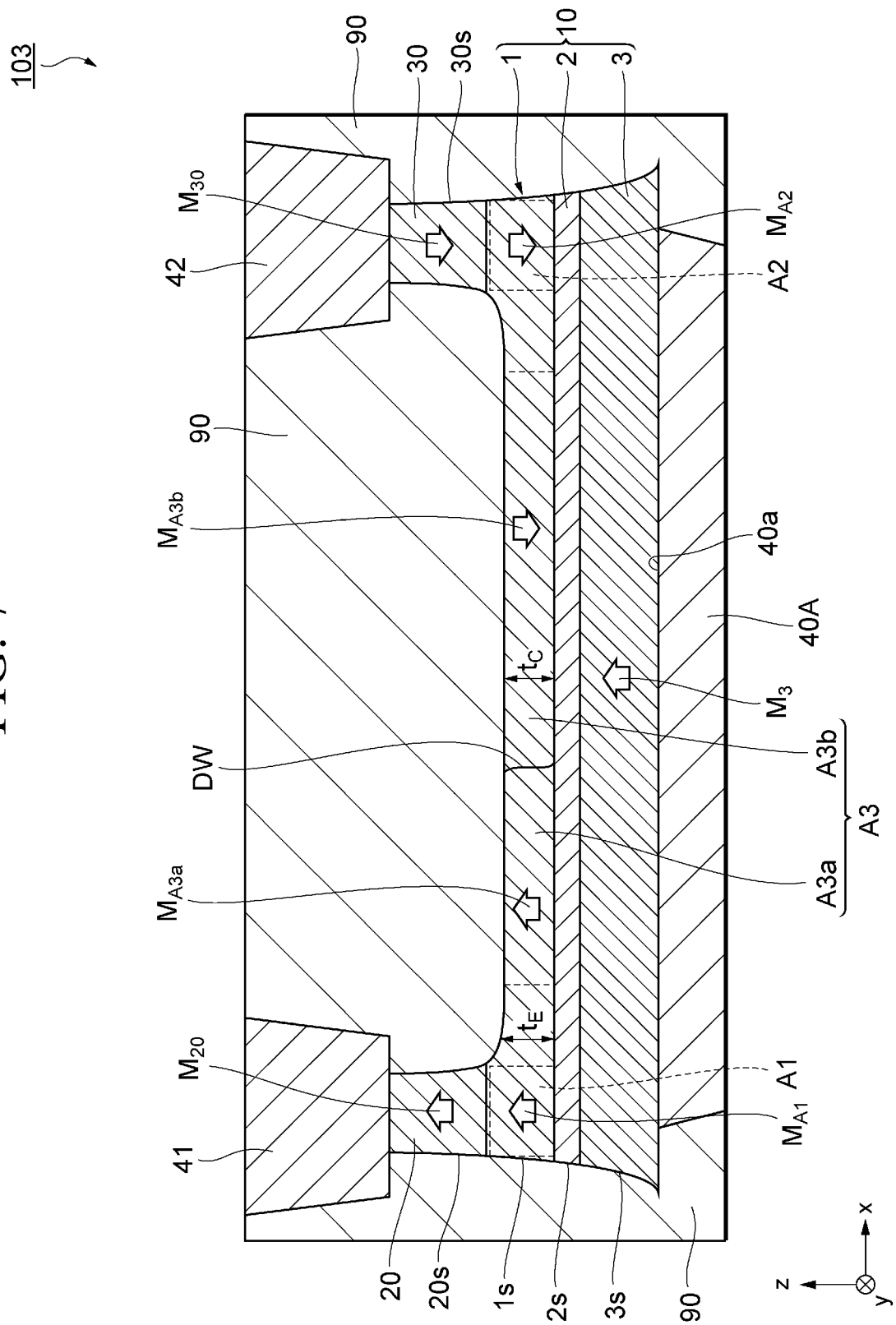
FIG. 7 is a cross-sectional view of a magnetic domain wall movement element according to a fourth embodiment.
Figure 8:
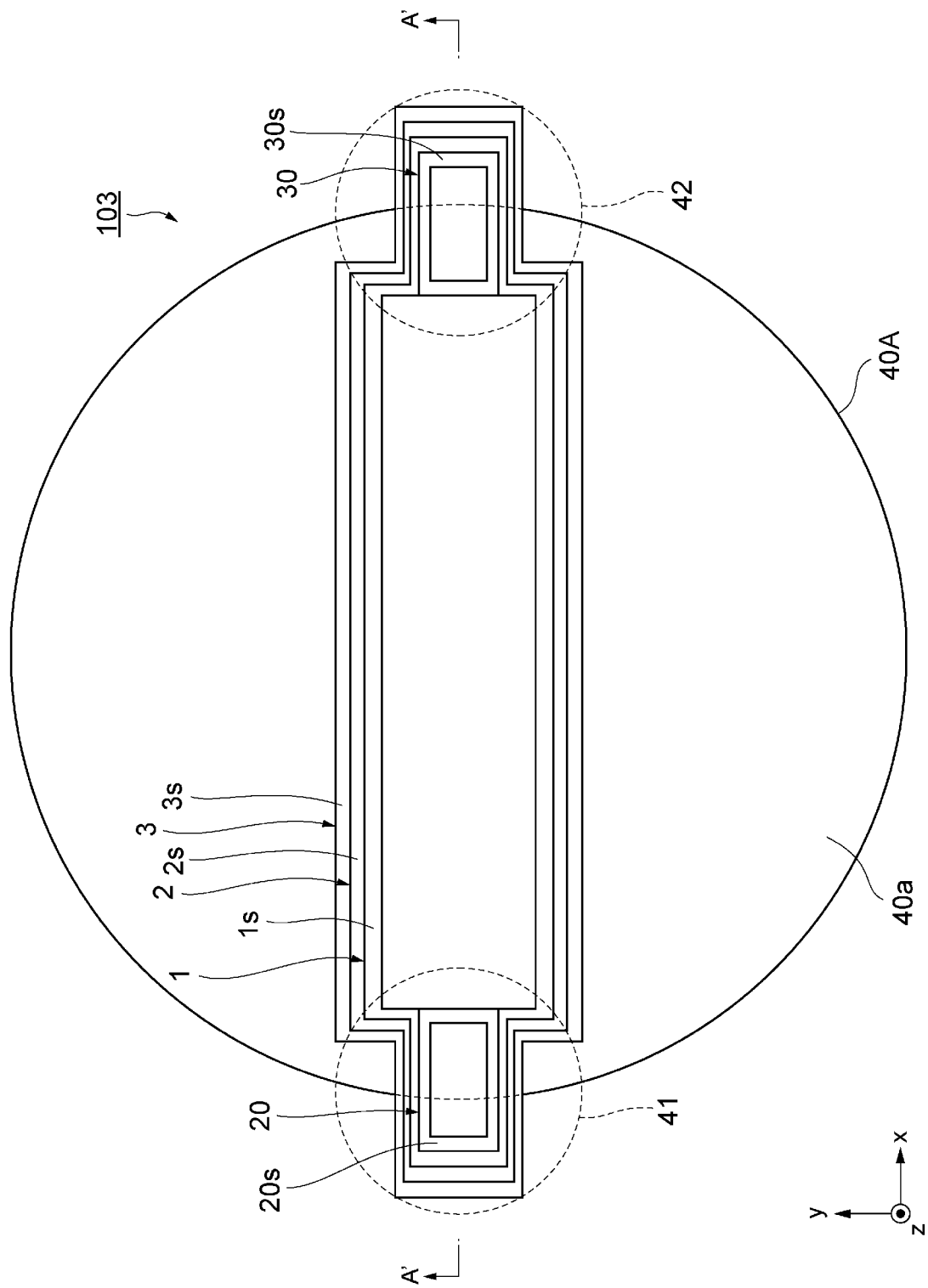
FIG. 8 is a plan view of the magnetic domain wall movement element according to the fourth embodiment.

FIG. 7 is a cross-sectional view of a magnetic domain wall movement element 103 according to a fourth embodiment cut along an xz plane that passes through the center of the magnetic domain wall movement layer 1 in the y direction. FIG. 7 is a cross section taken along the line A'-A' of FIG. 8. FIG. 8 is a plan view of the magnetic domain wall movement element 103 in a plan view in the z direction. In FIG. 8, a first electrode 41, a second electrode 42 and a part which overlaps a magnetoresistance effect part 10 of a third electrode 40A are indicated by dashed lines. The arrows shown in FIG. 7 are examples of the orientation direction of the magnetization of the ferromagnetic material. In the magnetic domain wall movement element 103 according to the fourth embodiment, the configuration of the third electrode 40A is different from that of the first embodiment. In the fourth embodiment, the same configurations as in the first embodiment are denoted with the same reference numerals and descriptions thereof will be omitted.

As shown in FIG. 7 and FIG. 8, a first surface 40a, which is a surface closest to the reference layer 3, of the third electrode 40A overlaps the entire third region A3 in a plan view in the z direction, and the outer circumference part thereof overlaps the first region A1 and the second region A2.

The magnetic domain wall movement element 103 according to the fourth embodiment has the same effects as the magnetic domain wall movement element 100 according to the first embodiment. In addition, when the first surface 40a of the third electrode 40A is disposed so that it overlaps the entire third region A3 in a plan view in the z direction, the flatness of the third region A3 is improved, and the magnetic domain wall DW moves smoothly.

The size of the via diameter may be fixed according to a production process in many cases. That is, there are restrictions on selection of the via diameter, and it may not be possible to increase the via diameter. The third region A3 is preferably as long as possible because the number of bits for multi-value data recording increases. When the outer circumference part of the first surface 40a of the third electrode 40A is disposed so that it overlaps the first region A1 and the second region A2 in a plan view in the z direction, it is possible to obtain an effect of improving the flatness of the third region A3 described above, and the third region A3 can be made the longest under the restriction of the via diameter.

Fifth Embodiment

Figure 9:
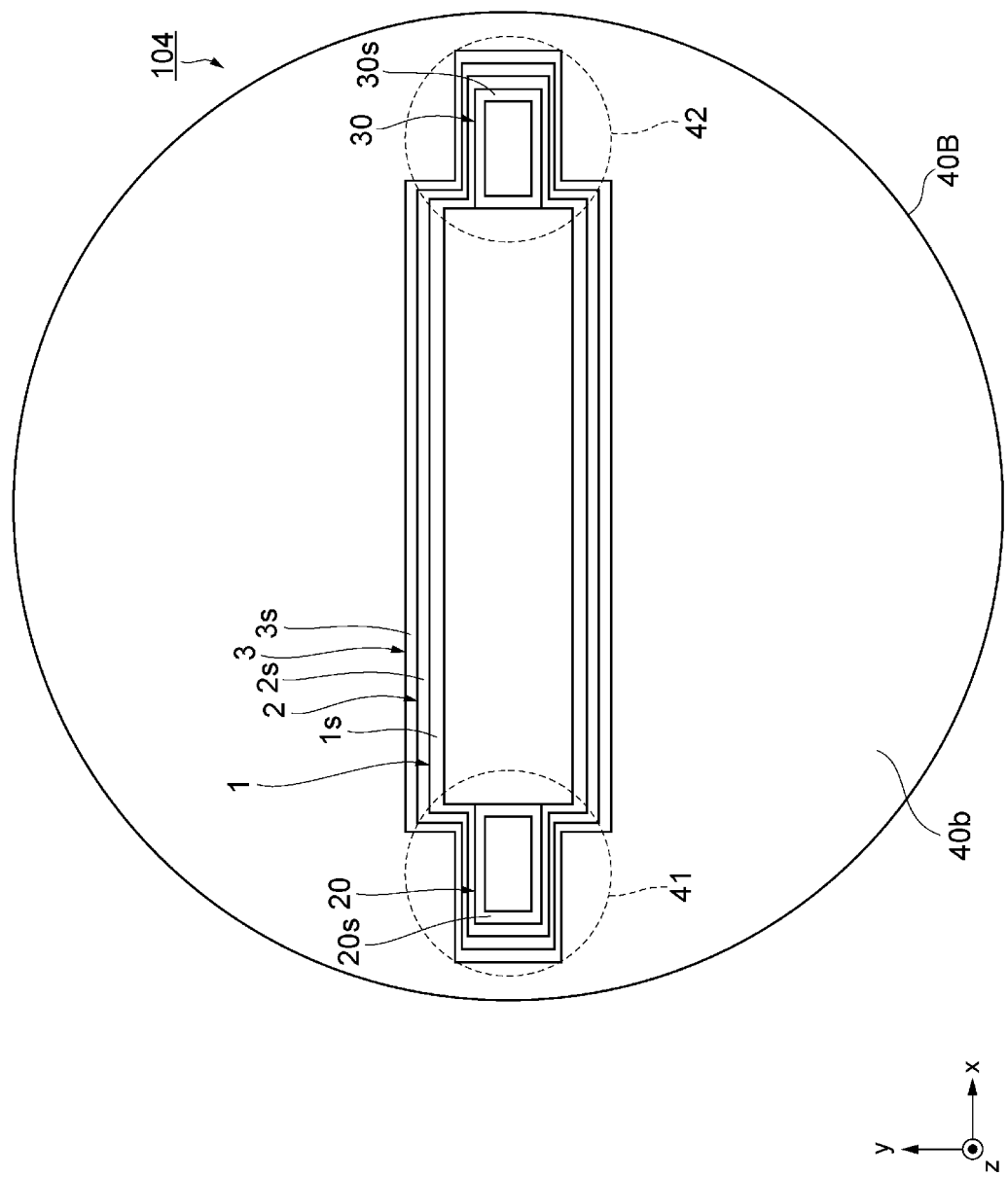
FIG. 9 is a plan view of a magnetic domain wall movement element according to a fifth embodiment.

FIG. 9 is a plan view of a magnetic domain wall movement element 104 according to a fifth embodiment in a plan view in the z direction. In FIG. 9, the first electrode 41 and the second electrode 42 are indicated by dashed lines. In the magnetic domain wall movement element 104 according to the fifth embodiment, the configuration of a third electrode 40B is different from that of the first embodiment. In the fifth embodiment, the same configurations as in the first embodiment are denoted with the same reference numerals and descriptions thereof will be omitted.

As shown in FIG. 9, a first surface 40b, which is a surface closest to the reference layer 3, of the third electrode 40B overlaps the entire magnetic domain wall movement layer 1 in a plan view in the z direction. The first surface 40b includes the magnetic domain wall movement layer 1 inside in the z direction.

The magnetic domain wall movement element 104 according to the fifth embodiment has the same effects as the magnetic domain wall movement element 100 according to the first embodiment. In addition, when the first surface 40b of the third electrode 40B containing a conductive material is disposed so that it overlaps the entire magnetic domain wall movement layer 1 in a plan view in the z direction, the heat dissipation of the entire magnetic domain wall movement layer 1 including the first region A1 and the second region A2 is improved. When the heat dissipation of the entire magnetic domain wall movement layer 1 is improved, the magnetization fixing function of the first region A1 and the second region A2 is stabilized, and the reliability of data recording is improved.

Sixth Embodiment

Figure 10:
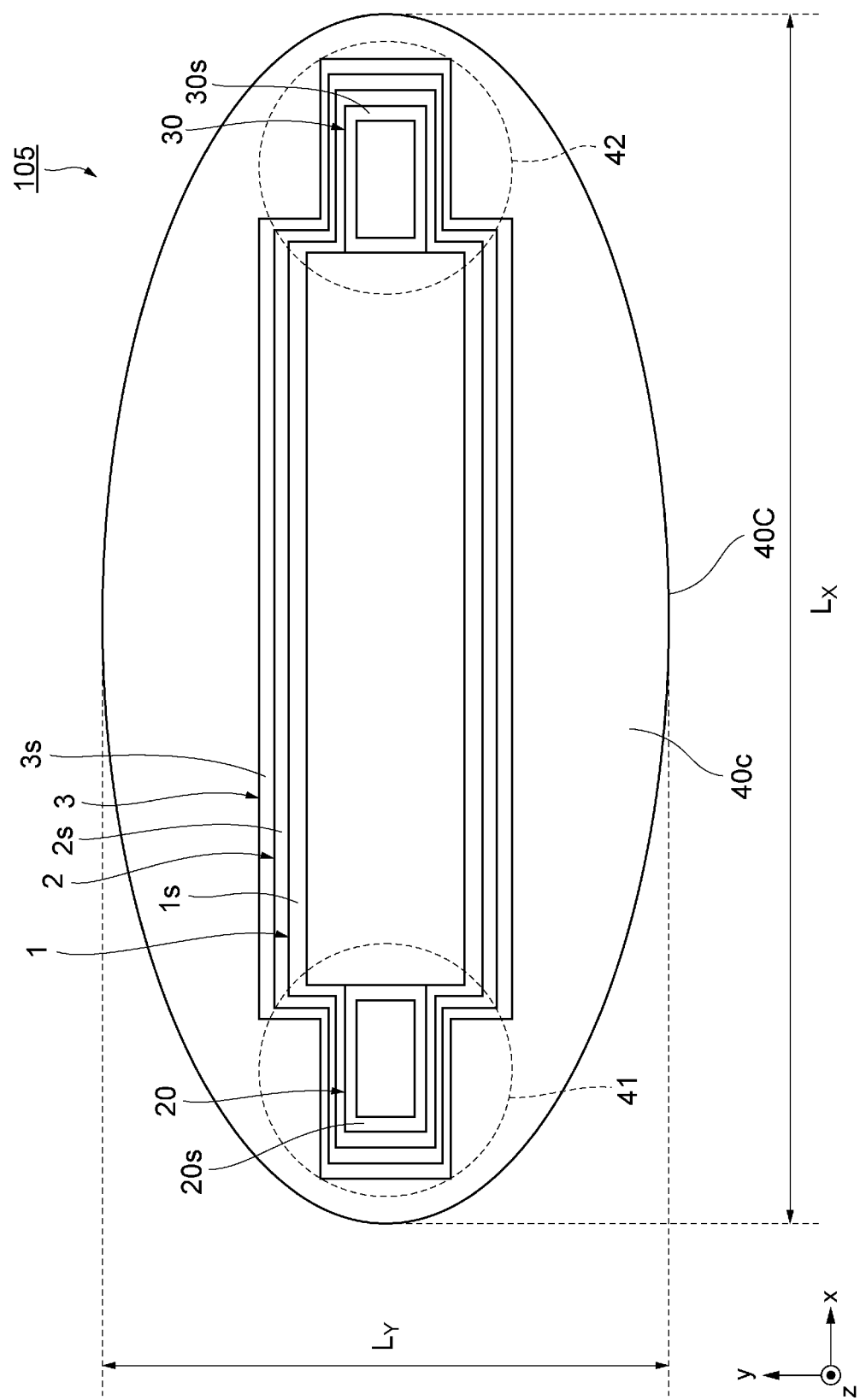
FIG. 10 is a plan view of a magnetic domain wall movement element according to a sixth embodiment.

FIG. 10 is a plan view of a magnetic domain wall movement element 105 according to a sixth embodiment in a plan view in the z direction. In FIG. 10, the first electrode 41 and the second electrode 42 are indicated by dashed lines. In the magnetic domain wall movement element 105 according to the sixth embodiment, the configuration of a third electrode 40C is different from that of the first embodiment. In the sixth embodiment, the same configurations as in the first embodiment are denoted with the same reference numerals and descriptions thereof will be omitted.

As shown in FIG. 10, a first surface 40c, which is a surface closest to the reference layer 3, of the third electrode 40C overlaps the entire magnetic domain wall movement layer 1 in a plan view in the z direction, and the maximum length $L_Y$ in the y direction is shorter than the maximum length $L_X$ in the x direction. The first surface 40c includes the magnetic domain wall movement layer 1 inside in the z direction.

The magnetic domain wall movement element 105 according to the sixth embodiment has the same effects as the magnetic domain wall movement element 100 according to the first embodiment. In order to increase the number of bits for multi-value data recording, the magnetic domain wall movement element preferably has a shape that is long in one direction. When the first surface 40c of the third electrode 40C is disposed so that it overlaps the entire magnetic domain wall movement layer 1 in a plan view in the z direction, it has a shape in which the maximum length $L_Y$ in the y direction is shorter than the maximum length $L_X$ in the x direction which is a direction in which the magnetic domain wall movement layer 1 extends, and thus the heat dissipation of the entire magnetic domain wall movement layer 1 is improved, the first surface 40c has a shape along the magnetic domain wall movement layer 1, and the integration of the magnetic domain wall movement element is improved.

Seventh Embodiment

Figure 11:
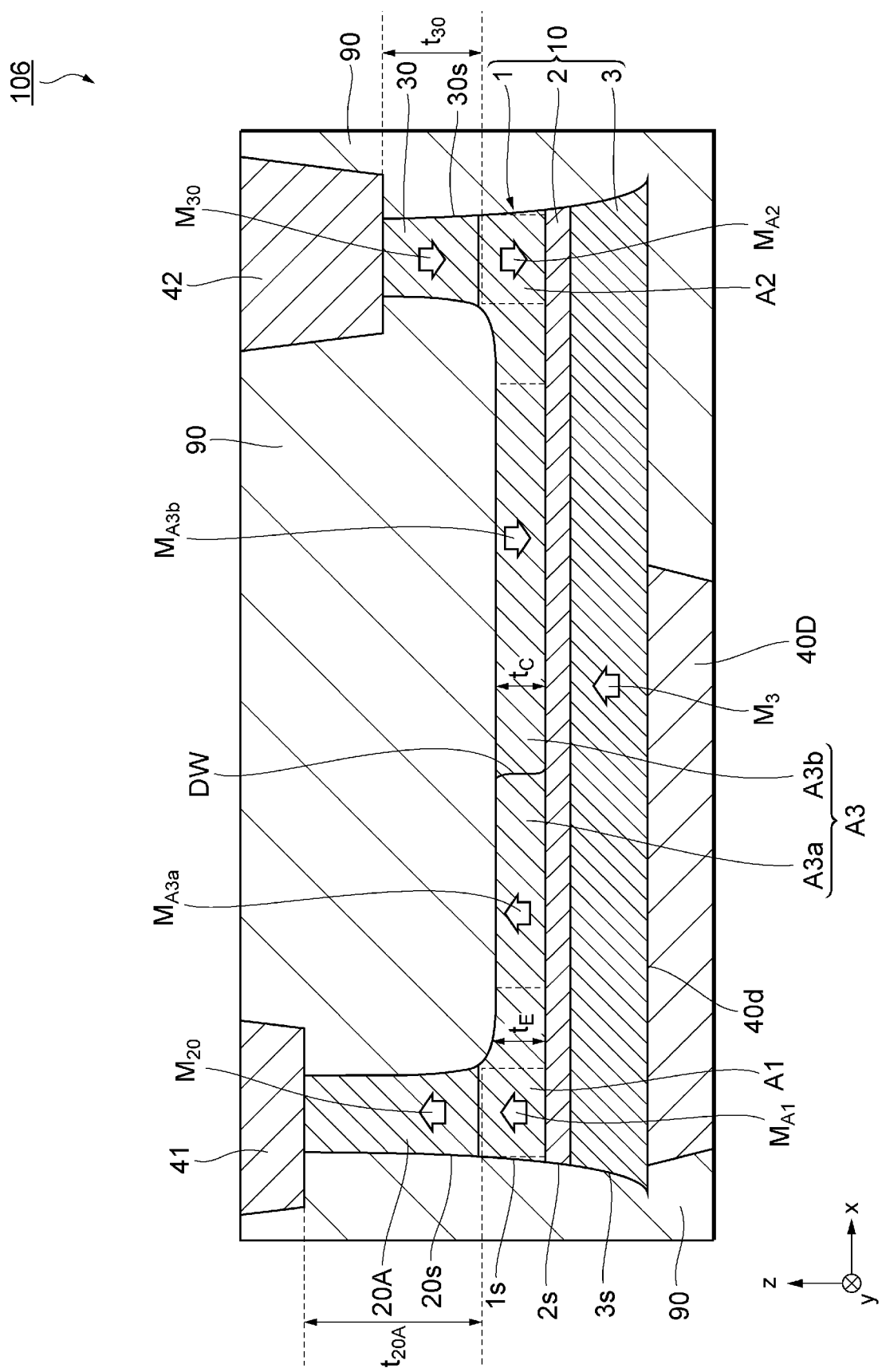
FIG. 11 is a cross-sectional view of a magnetic domain wall movement element according to a seventh embodiment.
Figure 12:
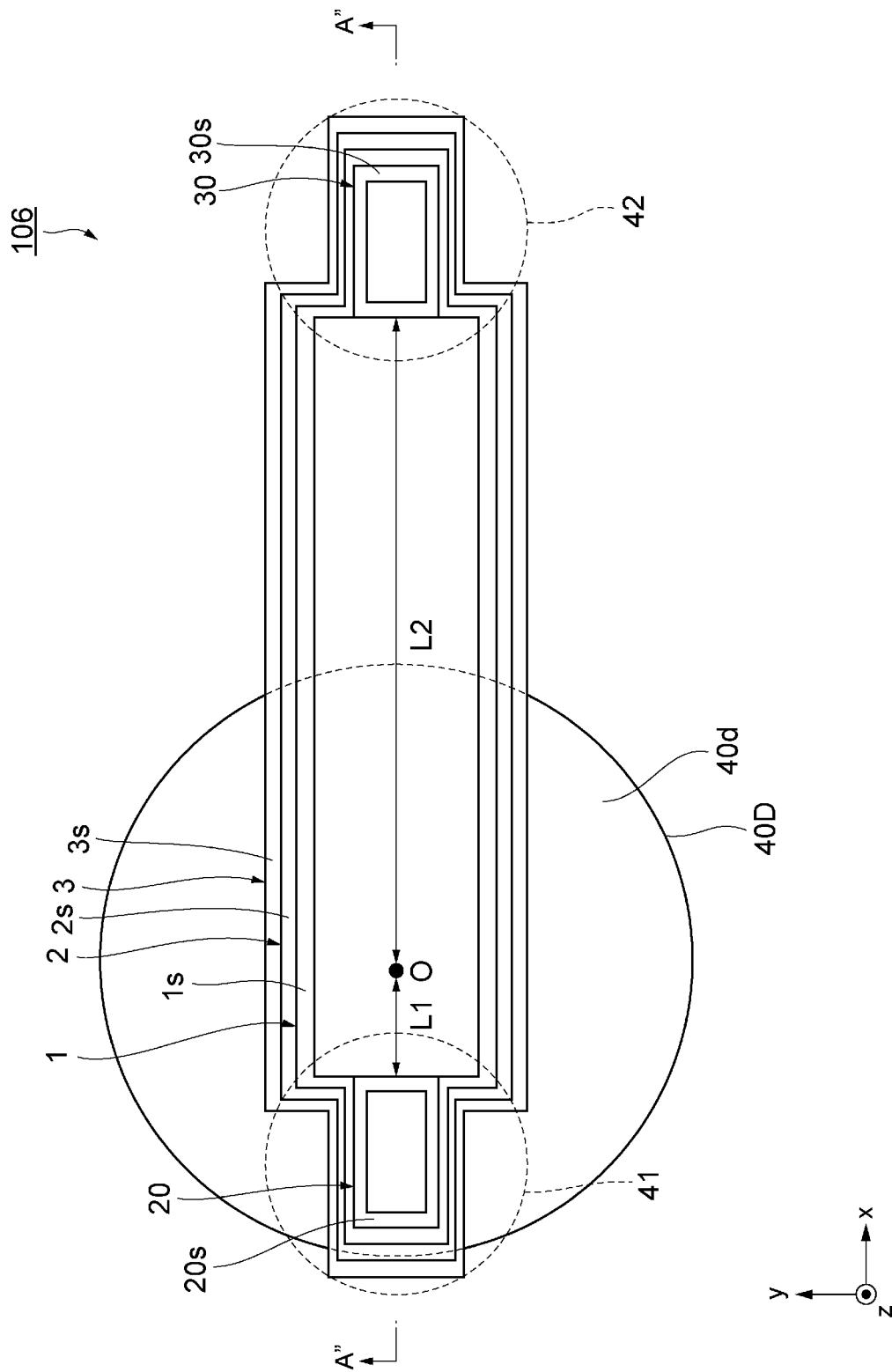
FIG. 12 is a plan view of the magnetic domain wall movement element according to the seventh embodiment.

FIG. 11 is a cross-sectional view of a magnetic domain wall movement element 106 according to a seventh embodiment cut along an xz plane that passes through the center of the magnetic domain wall movement layer 1 in the y direction. FIG. 11 is a cross section taken along the line A"-A" of FIG. 12. FIG. 12 is a plan view of the magnetic domain wall movement element 106 in a plan view in the z direction. In FIG. 12, parts of the first electrode 41 and the second electrode 42 overlapping the magnetoresistance effect part 10 of a third electrode 40D are indicated by dashed lines. Arrows shown in FIG. 11 are examples of the orientation direction of the magnetization of the ferromagnetic material. In the magnetic domain wall movement element 106 according to the seventh embodiment, the configurations of the first magnetization fixed layer 20 and the third electrode 40D are different from those of the first embodiment. In the seventh embodiment, the same configurations as in the first embodiment are denoted with the same reference numerals and descriptions thereof will be omitted.

As shown in FIG. 11, the film thickness $t_{20A}$ of a first magnetization fixed layer 20A is thicker than the film thickness $t_{20A}$ of the second magnetization fixed layer 30. When the film thickness $t_{20A}$ of the first magnetization fixed layer 20A and the film thickness $t_{30}$ of the second magnetization fixed layer 30 are different from each other, it is easy to fix the magnetizations in different directions by utilizing a difference in coercive force.

The magnetic domain wall movement element 106 according to the seventh embodiment has the same effects as the magnetic domain wall movement element 100 according to the first embodiment. As shown in FIG. 12, in a plan view in the z direction, the center of gravity of the third electrode 40D and the magnetic domain wall movement layer 1 deviates. As shown in FIG. 12, in a plan view in the z direction, a distance L1 between a geometric center O of a first surface 40d, which is a surface closest to the reference layer 3, of the third electrode 40D and the first magnetization fixed layer 20A is shorter than a distance L2 between the geometric center O of the first surface 40d and the second magnetization fixed layer 30. The first magnetization fixed layer 20A whose film thickness is thicker than the second magnetization fixed layer 30 has a larger resistance value than the second magnetization fixed layer 30 and tends to generate heat during data writing. By moving the first surface 40d of the third electrode 40D containing a conductive material toward the first magnetization fixed layer 20A, it is possible to minimize a heat distribution generated between the side of the first region A1 and the side of the magnetic domain wall movement layer 1 in the second region A2, and the reliability of data recording is improved. In FIG. 11 and FIG. 12, in a plan view in the z direction, an example in which the first surface 40d overlaps the first region A1 is shown, but the first surface 40d may overlap the first region A1 and the second region A2, and the first surface 40*d* may not overlap with either the first region A1 or the second region A2.

Eighth Embodiment

Figure 13:
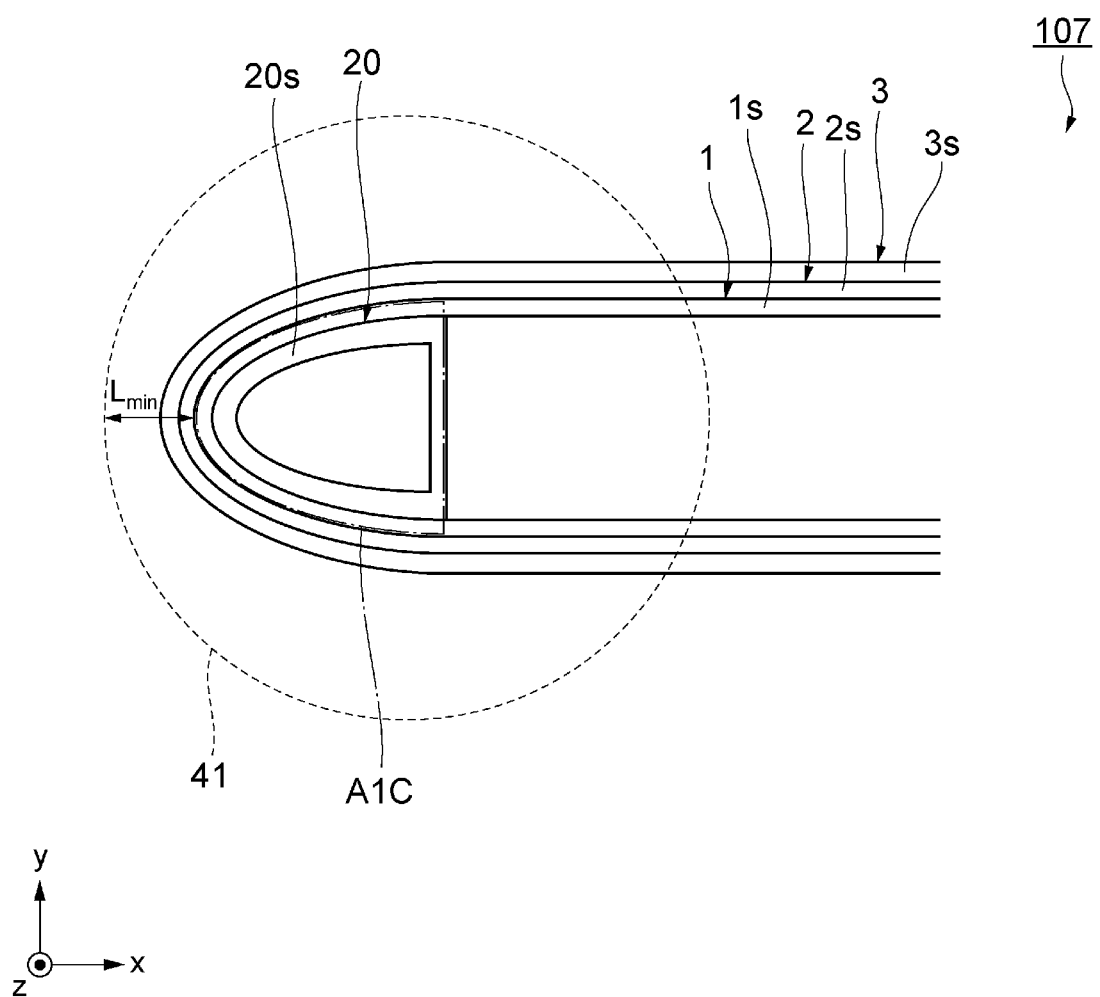
FIG. 13 is a plan view of a magnetic domain wall movement element according to an eighth embodiment.

FIG. 13 is a plan view of the vicinity of a first region A1C of a magnetic domain wall movement element 107 according to an eighth embodiment in a plan view in the z direction. In FIG. 13, the first electrode 41 is indicated by the dashed line. In the magnetic domain wall movement element 107 according to the eighth embodiment, the configuration of the first region A1 is different from that of the first embodiment. In the eighth embodiment, the same configurations as in the first embodiment are denoted with the same reference numerals and descriptions thereof will be omitted.

As shown in FIG. 13, the first electrode 41 overlaps the entire first region A1C in a plan view in the z direction. For example, the first electrode 41 includes the first region A1C inside in a plan view in the z direction. In a plan view in the z direction, the distance between the outer circumference of the first electrode 41 and the outer circumference of the first region A1C is the shortest ($L_{min}$), for example, at the end of the first region A1C in contact with the third region A3 and the end on the opposite side in the x direction. For example, in a plan view in the z direction, the distance between the outer circumference of the first electrode 41 and the outer circumference of the first region A1C changes continuously and is not constant. The distance between the outer circumference of the first electrode 41 and the outer circumference of the first region A1C is extremely small at the first point. The first region A1C has, for example, a curved outer circumference part other than the side in contact with the third region A3 in a plan view in the z direction.

The magnetic domain wall movement element 107 according to the eighth embodiment has the same effects as the magnetic domain wall movement element 100 according to the first embodiment. When the first region A1C overlaps the first electrode 41, the heat dissipation is improved. However, since the outer circumference part of the first electrode 41 is in contact with the insulation layer 90, the heat dissipation is poor as compared with the center part of the first electrode 41. When part of the first region AJC in which the distance from the outer circumference part of the first electrode 41 is short is minimized, it is possible to minimize a fluctuation of the magnetization of the first region A1C due to heat generation, and the reliability of data recording is improved. In FIG. 13, an example in which the distance between the outer circumference of the first electrode 41 and the outer circumference of the first region A1C is the shortest at the end of the first region A1C in contact with the third region A3 and the end on the opposite side in the x direction is shown, but a portion in which the distance between the outer circumference of the first electrode 41 and the outer circumference of the first region A1C is the shortest may be any other part.

So far, some embodiments have been described, and an example of the magnetic domain wall movement element has been described. However, the present invention is not limited to the embodiments, and various modifications can be made without changing the spirit of the invention.

Figure 14:
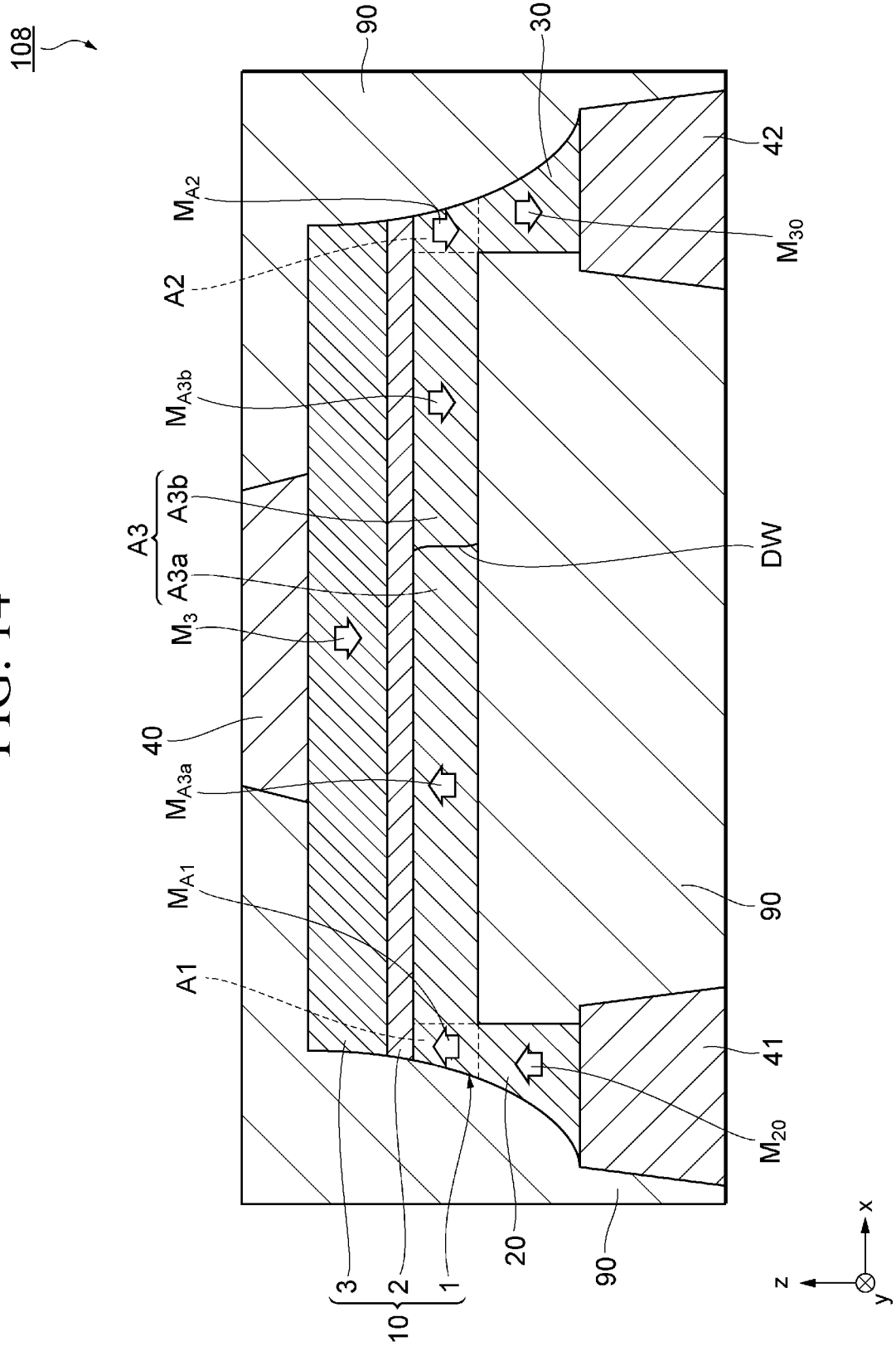
FIG. 14 is a cross-sectional view of a magnetic domain wall movement element according to Modification Example 1.

For example, an example in which the reference layer 3 is closer to the substrate Sub than the magnetic domain wall movement layer 1 has been shown so far, but as in Modification Example 1 shown in FIG. 14, the reference layer 3 may be located at a position further from the substrate Sub relative to the magnetic domain wall movement layer 1.

FIG. 14 is a cross-sectional view of a magnetic domain wall movement element 108 according to Modification Example 1 cut along an xz plane that passes through the center in the y direction. A structure in which the reference layer 3 in FIG. 14 is on the side further from the substrate relative to the magnetic domain wall movement layer 1 is referred to as a top pin structure.

In addition, feature configurations of the above embodiments and modification example may be combined.

EXPLANATION OF REFERENCES

1 Magnetic domain wall movement layer
2 Non-magnetic layer
3 Reference layer
10 Magnetoresistance effect part
20, 20A First magnetization fixed layer
30 Second magnetization fixed layer
40, 40A, 40B, 40C, 40D Third electrode
40*a*, 40*b*, 40*c*, 40*d* First surface
41 First electrode
42 Second electrode
90 Insulation layer
100, 101, 102, 103, 104, 105, 106, 107, 108 Magnetic domain wall movement element
200 Magnetic array
A1, A1A, A1B, A1C First region
A1Aa First part
A1Ab Second part
A2 Second region
A3, A3A Third region
CL Second wiring
DW Magnetic domain wall
RL Third wiring
Sub Substrate
SW1 First switching element
SW2 Second switching element
SW3 Third switching element
w1, w2 Wiring
WL First wiring

What is claimed is:

1. A magnetic domain wall movement element comprising a magnetoresistance effect part, a first electrode, a second electrode, a third electrode, a first magnetization fixed layer, a second magnetization fixed layer, and a substrate,
 wherein the magnetoresistance effect part includes a reference layer containing a ferromagnetic material, a magnetic domain wall movement layer containing a ferromagnetic material, and a non-magnetic layer interposed between the reference layer and the magnetic domain wall movement layer in a first direction,
 wherein the magnetic domain wall movement layer extends in a second direction orthogonal to the first direction,
 wherein the magnetic domain wall movement layer has a first region in which a magnetization direction is fixed, a second region in which a magnetization direction is fixed in a direction different from the magnetization direction of the first region, and a third region which is positioned between the first region and the second region in the second direction and in which a magnetization direction is variable,
 wherein the first electrode is electrically connected to the first region,
 wherein the second electrode is electrically connected to the second region, wherein the third electrode is electrically connected to the reference layer, and is positioned opposite to the non-magnetic layer with respect to the reference layer in the first direction, wherein the first magnetization fixed layer is positioned between the first region and the first electrode and fixes a magnetization of the first region, wherein the second magnetization fixed layer is positioned between the second region and the second electrode and fixes a magnetization of the second region, wherein the reference layer overlaps at least part of the first region and the second region in a plan view in the first direction, wherein at least part of the first region and the second region is shorter than the third region in a third direction orthogonal to the first direction and the second direction, and wherein the reference layer is closer to the substrate than the magnetic domain wall movement layer.

2. The magnetic domain wall movement element according to claim 1, wherein a length in the second direction of at least one of the first region and the second region is longer than a length in the third direction of at least one of the first region and the second region.

3. The magnetic domain wall movement element according to claim 1, wherein at least one of the first region and the second region has a first part that is longer than the third region in the third direction and a second part that is shorter than the third region in the third direction, and wherein the first part is closer to the third region than the second part in the second direction.

4. The magnetic domain wall movement element according to claim 1, wherein at least one of the first region and the second region gradually shortens in length in the third direction from a first end in contact with the third region toward a second end on the opposite side in the second direction.

5. The magnetic domain wall movement element according to claim 1, wherein, in a plan view in the first direction, the outer circumference of a first surface of the third electrode, which is a surface closest to the reference layer, overlaps at least one of the first region and the second region.

6. The magnetic domain wall movement element according to claim 1, wherein, in a plan view in the first direction, a first surface of the third electrode, which is a surface closest to the reference layer, includes the magnetic domain wall movement layer inside.

7. The magnetic domain wall movement element according to claim 1, wherein, in a first surface of the third electrode, which is a surface closest to the reference layer, the length of the longest part in the third direction is shorter than the length of the longest part in the second direction.

8. The magnetic domain wall movement element according to claim 1, wherein a film thickness of the first magnetization fixed layer is thicker than a film thickness of the second magnetization fixed layer, and wherein, in a plan view in the first direction, a distance from a geometric center of a first surface of the third electrode, which is a surface closest to the reference layer, to the first magnetization fixed layer is shorter than a distance from the geometric center of the first surface to the second magnetization fixed layer.

9. The magnetic domain wall movement element according to claim 1, wherein, in a plan view in the first direction, the first region is included in the first electrode, and a distance between the outer circumference of the first region and the outer circumference of the first electrode is the shortest at a first point.

10. A magnetic array comprising the plurality of magnetic domain wall movement elements according to claim 1.

11. A magnetic domain wall movement element comprising a magnetoresistance effect part, a first electrode, a second electrode, a third electrode, a first magnetization fixed layer, a second magnetization fixed layer, wherein the magnetoresistance effect part includes a reference layer containing a ferromagnetic material, a magnetic domain wall movement layer containing a ferromagnetic material, and a non-magnetic layer interposed between the reference layer and the magnetic domain wall movement layer in a first direction, wherein the magnetic domain wall movement layer extends in a second direction orthogonal to the first direction, wherein the magnetic domain wall movement layer has a first region in which a magnetization direction is fixed, a second region in which a magnetization direction is fixed in a direction different from the magnetization direction of the first region, and a third region which is positioned between the first region and the second region in the second direction and in which a magnetization direction is variable, wherein the first electrode is electrically connected to the first region, wherein the second electrode is electrically connected to the second region, wherein the third electrode is electrically connected to the reference layer, and is positioned opposite to the non-magnetic layer with respect to the reference layer in the first direction, wherein the first magnetization fixed layer is positioned between the first region and the first electrode and fixes a magnetization of the first region, wherein the second magnetization fixed layer is positioned between the second region and the second electrode and fixes a magnetization of the second region, wherein the reference layer overlaps at least part of the first region and the second region in a plan view in the first direction, wherein at least part of the first region and the second region is shorter than the third region in a third direction orthogonal to the first direction and the second direction, and wherein, in the third region, a film thickness at an end in the second direction is thicker than a film thickness of a center part in the second direction, and a length of the end in the third direction is shorter than a length of the center part in the third direction.

* * * * *